(12) United States Patent
Ren et al.

(10) Patent No.: US 12,196,692 B2
(45) Date of Patent: Jan. 14, 2025

(54) SYSTEMS AND METHODS FOR VOLTAGE CONTRAST DEFECT DETECTION

(71) Applicant: ASML NETHERLANDS B.V., Veldhoven (NL)

(72) Inventors: Weiming Ren, San Jose, CA (US); Xuedong Liu, San Jose, CA (US); Zhong-wei Chen, San Jose, CA (US); Xiaoyu Ji, Beijing (CN); Xiaoxue Chen, Fremont, CA (US); Weimin Zhou, San Jose, CA (US); Frank Nan Zhang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 410 days.

(21) Appl. No.: 17/769,690

(22) PCT Filed: Sep. 30, 2020

(86) PCT No.: PCT/EP2020/077276
§ 371 (c)(1),
(2) Date: Apr. 15, 2022

(87) PCT Pub. No.: WO2021/073868
PCT Pub. Date: Apr. 22, 2021

(65) Prior Publication Data
US 2022/0375712 A1 Nov. 24, 2022

Related U.S. Application Data

(60) Provisional application No. 63/032,134, filed on May 29, 2020, provisional application No. 62/923,286, filed on Oct. 18, 2019.

(51) Int. Cl.
*G01N 23/2202* (2018.01)
*G01N 1/44* (2006.01)
(Continued)

(52) U.S. Cl.
CPC ........... *G01N 23/2202* (2013.01); *G01N 1/44* (2013.01); *G01N 23/2251* (2013.01);
(Continued)

(58) Field of Classification Search
CPC .. G01N 23/2202; G01N 1/44; G01N 23/2251; G01N 2223/418;
(Continued)

(56) References Cited

U.S. PATENT DOCUMENTS

| 4,687,940 A | 8/1987 | Ward et al. |
| 5,920,073 A | 7/1999 | Lo et al. |

(Continued)

FOREIGN PATENT DOCUMENTS

| TW | 445561 B | 7/2001 |
| TW | 201910757 A | 3/2019 |

(Continued)

OTHER PUBLICATIONS

International Search Report and Written Opinion received from the International Search Authority issued in related International Application No. PCT/EP2020/077276, mailed Jan. 11, 2021.

(Continued)

*Primary Examiner* — David A Vanore
(74) *Attorney, Agent, or Firm* — Finnegan, Henderson, Farabow, Garrett & Dunner, LLP

(57) ABSTRACT

Systems and methods of providing a probe spot in multiple modes of operation of a charged-particle beam apparatus are disclosed. The method may comprise activating a charged-particle source to generate a primary charged-particle beam and selecting between a first mode and a second mode of operation of the charged-particle beam apparatus. In the flooding mode, the condenser lens may focus at least a first portion of the primary charged-particle beam passing through an aperture of the aperture plate to form a second (Continued)

portion of the primary charged-particle beam, and substantially all of the second portion is used to flood a surface of a sample. In the inspection mode, the condenser lens may focus a first portion of the primary charged-particle beam such that the aperture of the aperture plate blocks off peripheral charged-particles to form the second portion of the primary charged-particle beam used to inspect the sample surface.

20 Claims, 21 Drawing Sheets

(51) Int. Cl.
*G01N 23/2251* (2018.01)
*H01J 37/02* (2006.01)
*H01J 37/244* (2006.01)
*H01J 37/28* (2006.01)

(52) U.S. Cl.
CPC .......... *H01J 37/026* (2013.01); *H01J 37/244* (2013.01); *H01J 37/28* (2013.01); *G01N 2223/418* (2013.01); *G01N 2223/6116* (2013.01); *H01J 2237/0044* (2013.01); *H01J 2237/0048* (2013.01); *H01J 2237/0453* (2013.01); *H01J 2237/0458* (2013.01); *H01J 2237/24592* (2013.01)

(58) Field of Classification Search
CPC ...... G01N 2223/6116; H01J 2237/0458; H01J 2237/28; H01J 2237/2817; H01J 2237/0044; H01J 2237/0048; H01J 2237/0453; H01J 37/266; H01J 37/026
See application file for complete search history.

(56) References Cited

U.S. PATENT DOCUMENTS

| | | | |
|---|---|---|---|
| 6,091,249 A | 7/2000 | Talbot et al. | |
| 6,627,884 B2* | 9/2003 | McCord | H01J 37/28 378/85 |
| 6,930,309 B1* | 8/2005 | Mankos | H01J 37/026 250/307 |
| 7,019,292 B1* | 3/2006 | Fan | H01J 37/28 250/397 |
| 9,165,742 B1* | 10/2015 | Simmons | H01J 37/06 |
| 9,184,024 B2 | 11/2015 | Chen | |
| 10,784,077 B2 | 9/2020 | Zhang et al. | |
| 11,152,191 B2 | 10/2021 | Yin et al. | |
| 2008/0067381 A1* | 3/2008 | Hiroi | H01J 37/222 250/310 |
| 2009/0206255 A1* | 8/2009 | Saito | G01N 23/2251 250/310 |
| 2013/0277554 A1 | 10/2013 | Ren et al. | |
| 2015/0060662 A1 | 3/2015 | Chen et al. | |
| 2017/0025243 A1 | 1/2017 | Ren et al. | |
| 2018/0130632 A1 | 5/2018 | Ogasawara et al. | |
| 2019/0043691 A1 | 2/2019 | Zhang et al. | |
| 2021/0116398 A1* | 4/2021 | Ren | H01J 37/244 |
| 2022/0375712 A1* | 11/2022 | Ren | H01J 37/244 |

FOREIGN PATENT DOCUMENTS

| | | |
|---|---|---|
| TW | 201937526 A | 9/2019 |
| TW | 201940841 A | 10/2019 |
| WO | WO 2019/063561 A1 | 4/2019 |

OTHER PUBLICATIONS

Office Action issued by the Intellectual Property Office (IPO) in related ROC (Taiwan) Patent Application No. 109135437, mailed Sep. 3, 2021.

* cited by examiner

SYSTEMS AND METHODS FOR VOLTAGE CONTRAST DEFECT DETECTION

CROSS-REFERENCE TO RELATED APPLICATIONS

This application claims priority to International Application No. PCT/EP2020/077276, filed Sep. 30, 2020, and published as WO 2021/073868 A1, which claims priority of U.S. 62/923,286 which was filed on Oct. 18, 2019 and U.S. application 63/032,134 which was filed on May 29, 2020. The contents of these applications are incorporated herein by reference in their entireties.

TECHNICAL FIELD

The embodiments provided herein disclose a charged-particle beam apparatus, and more particularly an electron microscope with enhanced imaging resolution and throughput by reducing Coulomb interaction effects between the charged particles of a charged particle beam.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, resolution and throughput in defect detection become more important. For voltage-contrast detect defection, single-beam inspection tools may be used in a flooding mode and an inspection mode. Although the throughput may be increased by keeping the tool parameters unchanged between the flooding and the inspection modes, the increased Coulomb interaction effects may negatively impact the resolution, rendering the inspection tool inadequate for its desired purpose.

SUMMARY

One aspect of the present disclosure is directed to a charged-particle beam apparatus. The apparatus may comprise a charged-particle source configured to generate a primary charged-particle beam along a primary optical axis, a first aperture array comprising a first aperture configured to allow at least a first portion of the primary charged-particle beam to pass through, a condenser lens configured to focus the at least a first portion of the primary charged-particle beam based on a selected mode of operation of the apparatus, wherein the selected mode of operation includes a first mode and a second mode, and an aperture plate comprising a second aperture configured to form a second portion of the primary charged-particle beam. In the first mode of operation, substantially all of the second portion of the primary charged-particle beam is used to flood a surface of a sample, and in the second mode of operation, at least some of the second portion of the primary charged-particle beam is used to inspect the surface of the sample.

The first aperture may be configured to block peripheral charged particles of the primary charged-particle beam to form the first portion of the primary charged-particle beam and the first aperture array includes at least two apertures that are dissimilar in size. The first aperture array may be disposed in and is movable in a first plane substantially perpendicular to the primary optical axis. The first aperture array may be disposed between the charged-particle source and the condenser lens along the primary optical axis.

The second aperture may be a current-limiting aperture configured to in the first mode of operation, allow substantially all charged particles of the first portion of the primary charged-particle beam to pass through to form the second portion of the primary charged-particle beam, and in the second mode of operation, block peripheral charged particles of the first portion of the primary charged-particle beam to form the second portion of the primary charged-particle beam. The aperture plate may be movable along the primary optical axis. The aperture plate may comprise a current-limiting aperture array movable along the primary optical axis. The current-limiting aperture array may be movable along the primary optical axis between the condenser lens and an objective lens. The current-limiting aperture array may be movable along a second plane substantially perpendicular to the primary optical axis.

The apparatus may further comprise a beam-limiting aperture array configured to limit a beam current of the second portion of the primary charged-particle beam. The beam-limiting aperture array may comprise a plurality of beam-limiting apertures, and at least two beam-limiting apertures of the plurality of beam-limiting apertures are dissimilar in size. The beam-limiting aperture array may be disposed in and is movable in a third plane substantially perpendicular to the primary optical axis. In the first and the second modes of operation, the first aperture and a beam-limiting aperture of the plurality of beam-limiting apertures may be the same.

In the first mode of operation, the condenser lens may be configured to cause substantially all of the second portion of the primary charged-particle beam to form a cross-over close to the third plane such that substantially all charged particles of the second portion of the primary charged-particle beam pass through an aperture of the beam-limiting aperture array. In the first mode of operation, the objective lens is configured to defocus the second portion of the primary charged-particle beam and to form a first spot on the surface of the sample, the first spot having a first current level.

In the second mode of operation, the aperture of the beam-limiting aperture array is configured to limit a beam current of the second portion of the primary charged-particle beam. In the second mode of operation, the objective lens is configured to focus the at least some of the second portion of the primary charged-particle beam to form a second spot on the surface of the sample, the second spot having a second current level. The first current level may be greater than or equal to the second current level. The first spot may be larger than or equal to the second spot.

The apparatus may further comprise a controller configured to perform charged-particle flooding on the surface of the sample in the first mode; and perform charged-particle beam inspection of the surface of the sample in the second mode. The controller may be further configured to adjust an electrical excitation of the condenser lens based on the selected mode of operation. The electrical excitation of the objective lens in the first mode of operation may be the same or substantially similar to an electrical excitation of the objective lens in the second mode of operation.

Another aspect of the present disclosure is directed to a method of forming a probe spot on a surface of a sample in a charged-particle beam apparatus comprising a first aperture array, a condenser lens, a second aperture array, and an aperture plate. The method may comprise activating a charged-particle source to generate a primary charged-particle beam along a primary optical axis, and selecting between a first mode and a second mode of operation of the charged-particle beam apparatus. In the first mode of operation, the condenser lens may be configured to focus at least a first portion of the primary charged-particle beam such that the at least a first portion passes through an aperture of the aperture plate to form a second portion of the primary charged-particle beam, and substantially all of the second portion may be used to flood a surface of a sample, and in the second mode of operation, the condenser lens may be configured to focus the at least a first portion of the primary charged-particle beam such that the aperture of the aperture plate blocks off peripheral charged-particles of the at least a first portion to form the second portion of the primary charged-particle beam, and at least some of the second portion of the primary charged-particle beam is used to inspect the surface of the sample.

The method may further comprise blocking peripheral charged particles of the primary charged-particle beam to form the at least the first portion of the primary charged-particle beam. The first aperture array may be disposed in and is movable in a first plane substantially perpendicular to the primary optical axis. The first aperture array may be disposed between the charged-particle source and the condenser lens. Forming the at least the first portion of the primary charged-particle beam may comprise adjusting a position of the first aperture array in the first plane such that a center of an aperture of the first aperture array is aligned with the primary optical axis. The aperture plate may be movable along the primary optical axis. The aperture plate may comprise a current-limiting aperture array movable along the primary optical axis. The current-limiting aperture array may be movable along the primary optical axis between the condenser lens and an objective lens. The current-limiting aperture array may be movable along a second plane substantially perpendicular to the primary optical axis.

In the first mode of operation, the method may comprise defocusing the second portion of the primary charged-particle beam and forming a first spot on the surface of the sample, the first spot having a first current level.

In the second mode, the method may comprise limiting a beam current of the second portion of the primary charged-particle beam using the second aperture array, an aperture of the second aperture array configured to form the at least some of the second portion of the primary charged-particle beam; and focusing the at least some of the second portion of the primary charged-particle beam and forming a second spot on the surface of the sample, the second spot having a second current level. The first current level may be greater than or equal to the second current level. The first spot may be larger than or equal to the second spot. In the first and the second modes of operation, the first aperture and a beam-limiting aperture of the plurality of beam-limiting apertures may be the same.

The method may comprise switching, using a controller, between the first mode and the second mode of operation. The method may further comprise adjusting, using the controller, an electrical excitation of the condenser lens based on the selected mode of operation. The method may further comprise performing charged-particle flooding on the surface of the sample in the first mode of operation, and performing charged-particle beam inspection of the surface of the sample in the second mode of operation.

Another aspect of the present disclosure is directed to a non-transitory computer readable medium storing a set of instructions that is executable by one or more processors of a charged-particle beam apparatus to cause the charged particle beam apparatus to perform a method of inspecting a sample. The method may comprise activating a charged-particle source to generate a primary charged-particle beam along a primary optical axis, and selecting between a first mode and a second mode of operation of the charged-particle beam apparatus. In the first mode of operation, the condenser lens may be configured to focus at least a first portion of the primary charged-particle beam such that the at least a first portion passes through an aperture of the aperture plate to form a second portion of the primary charged-particle beam, and substantially all of the second portion may be used to flood a surface of a sample, and in the second mode of operation, the condenser lens may be configured to focus the at least a first portion of the primary charged-particle beam such that the aperture of the aperture plate blocks off peripheral charged-particles of the at least a first portion to form the second portion of the primary charged-particle beam, and at least some of the second portion of the primary charged-particle beam is used to inspect the surface of the sample.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
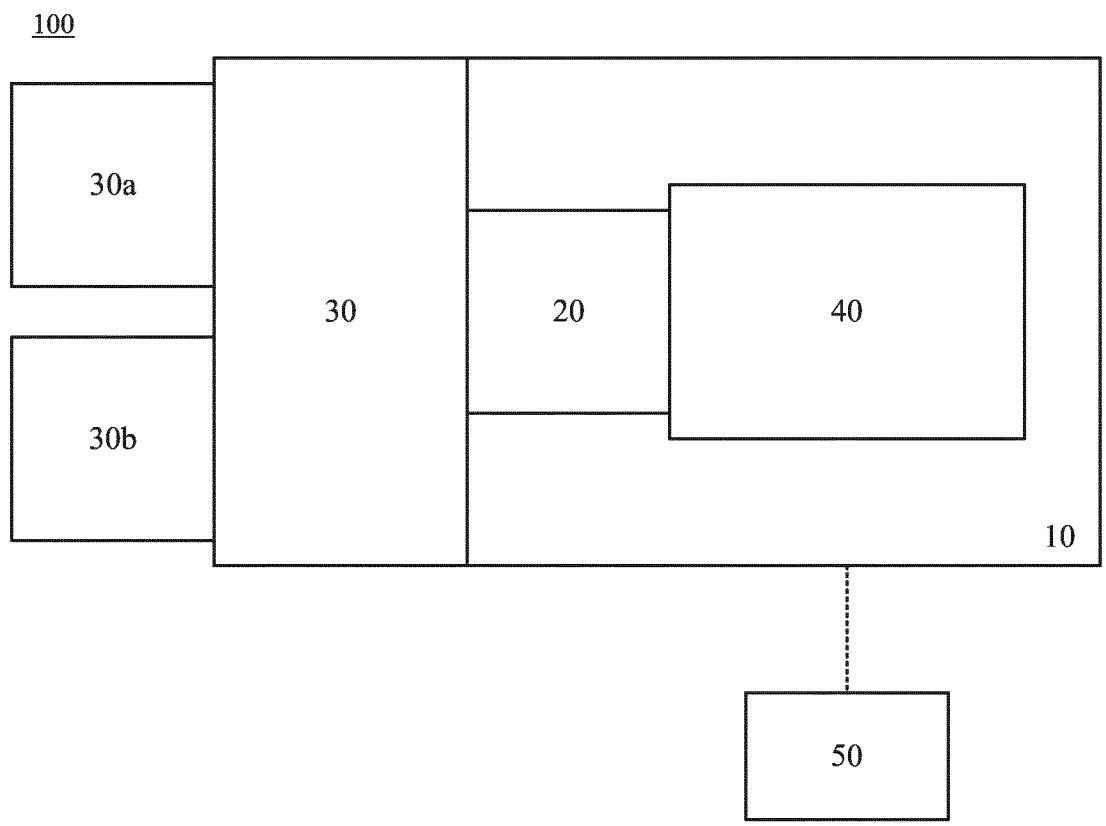
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Detecting buried defects in vertical high-density structures such as 3D NAND flash memory devices, can be challenging. One of several ways to detect buried or on-surface electrical defects in such devices is by using a voltage contrast method in a SEM. In this method, electrical conductivity differences in materials, structures, or regions of a sample cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, a process called pre-charging or flooding may be employed in which the region of interest of the sample may be exposed to a large beam current before an inspection using a small beam current but high imaging resolution. For the inspection, some of the advantages of flooding may include reduction of charging of the wafer to minimize distortion of images due to the charging, and in some cases, increase of charging of the wafer to enhance difference of defective and surrounding non-defective features in images, among other things.

Some inspection systems, such as a SEM, equipped to detect defects of a wafer using the voltage contrast method may be operated in multiple modes such as a flooding mode to highlight the defect, followed by an inspection mode to detect the defect. In some inspection systems, to increase inspection resolution, a Coulomb aperture array (e.g., coulomb aperture array 224 of FIGS. 2A and 2B) may be placed above a beam-limiting aperture array (e.g., beam-limiting aperture array 235 of FIG. 2A and 2B) to reduce Coulomb interaction effects in the inspection mode. In addition, to increase throughput by eliminating moving the wafer to align with a flooding electron beam or an inspection beam, the primary beam with a large current may be used in the flooding mode (dash line in FIG. 2B) and the primary beam with a small current may be used in the inspection mode (solid line in FIG. 2B). To further increase the throughput, the same in-use aperture of Coulomb aperture array and the in-use aperture of the beam-limiting aperture array may be used in the flooding mode and the inspection mode. In the flooding mode, it may be preferable to allow maximum electrons to pass through an aperture and maximize the beam current of the primary electron beam irradiating the sample, to enhance the voltage contrast, and a large aperture of the Coulomb aperture array may therefore be desired. In the inspection mode, however, a small probe spot having a small beam current may be desirable for high resolution imaging. If the large aperture of the Coulomb aperture array is used in the inspection mode, the large beam current may negatively impact the imaging resolution due to increased Coulomb interaction effects. For voltage contrast defect detection in a SEM, switching between the flooding and inspection modes may include adjusting the beam current, for example, by selecting the aperture size of the Coulomb aperture array. Selecting and aligning apertures to produce the desired beam current may take several seconds and may reduce the overall inspection throughput, among other things. Therefore, for voltage contrast defect detection, it may be desirable to quickly adjust the beam current based on a selected mode of operation to maintain high inspection throughput.

In some embodiments of the present disclosure, a charged-particle beam apparatus may include an electron source configured to emit electrons along a primary optical axis to form the primary electron beam. The apparatus may also include a current-limiting aperture plate placed between the Coulomb aperture array and the beam-limiting aperture array. An aperture of the Coulomb aperture array may be configured to allow a first portion of the primary electron beam to pass through, a condenser lens configured to focus the first portion of the primary electron beam based on a selected mode of operation, and an aperture of the current-limiting aperture plate may be configured to allow all or a portion of the first portion of the primary electron beam to pass through based on the selected mode of operation. The portion passing through the aperture of the current-limiting aperture plate is a second portion of the primary electron beam. Subsequently, all or a portion of the second portion may pass through an aperture of a beam-limiting aperture array. The portion passing through the aperture of the beam-limiting aperture array is a third portion of the primary electron beam. Based on the mode of operation, the third portion of the primary electron beam may be used to flood or inspect a surface of the sample. Using the current-limiting aperture plate to block off peripheral electrons of the first portion of the primary charged-particle beam may allow a user to avoid switching the apertures of a Coulomb aperture array without sacrificing image resolution in the inspection mode, thus reducing system-related delays and maintaining high throughput.

When the charged-particle beam apparatus is operating in the flooding mode, the electrons in the primary electron beam may have substantially high energy. Therefore, during the flooding mode, when these primary electrons hit the sample, signal electrons with high energy can be generated from the sample. If these high-energy signal electrons hit an electron detector, the detector surface can be contaminated with the built-up electron charges, which may deteriorate the performance of the detector. Furthermore, the electronic circuitry (e.g., a low-noise amplifier) that are connected to the detector may be damaged due to a surge current or overcurrent caused by the high-energy signal electrons. To protect the electron detector during the flooding mode, in some embodiments, the charged-particle beam apparatus can have a detector protection mechanism that is configured to prevent the high-energy signal electrons from reaching the electron detector when the apparatus operates in the flooding mode.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary charge particle beam inspection system 100, such as an electron beam inspection (EBI) system, consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2A:
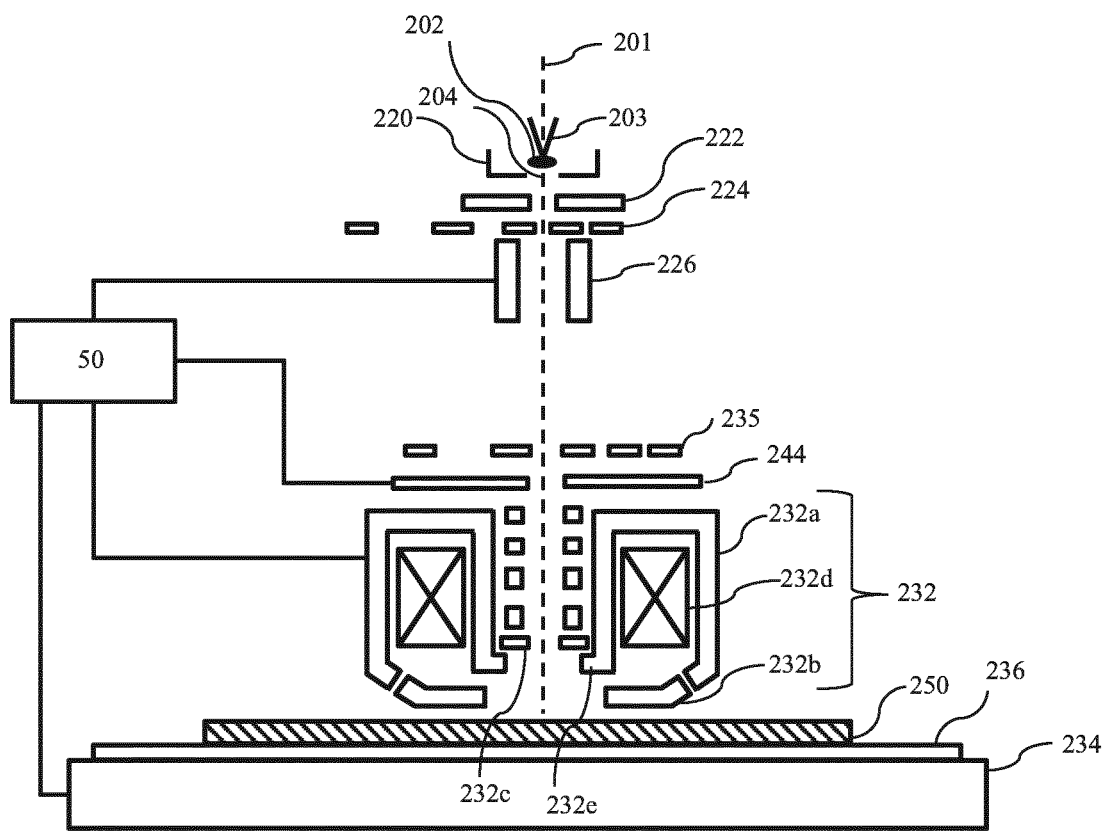
FIGS. 2A and 2B are schematic diagrams illustrating an exemplary electron beam tool and beam paths thereof, that can be a part of the exemplary electron beam inspection system of FIG. 1, consistent with embodiments of the present disclosure.

Reference is now made to FIG. 2A, which is a schematic diagram illustrating an exemplary configuration of an electron beam tool 40 that can be a part of the charged particle beam inspection system 100 of FIG. 1, consistent with embodiments of the present disclosure. Electron beam tool 40 (also referred to herein as apparatus 40) may comprise an electron emitter, which may comprise a cathode 203, an anode 220, and a gun aperture 222. Electron beam tool 40 may further include a Coulomb aperture array 224, a condenser lens 226, a beam-limiting aperture array 235, an objective lens assembly 232, and an electron detector 244. Electron beam tool 40 may further include a sample holder 236 supported by motorized stage 234 to hold a sample 250 to be inspected. It is to be appreciated that other relevant components may be added or omitted, as needed.

Although FIG. 2A shows electron beam tool 40 as a single-beam inspection tool that uses only one primary electron beam to scan one location of sample 250 at a time, electron beam tool 40 may also be a multi-beam inspection tool that employs multiple primary electron beamlets to simultaneously scan multiple locations on sample 250.

In some embodiments, electron emitter may include cathode 203, an extractor anode 220, wherein primary electrons can be emitted from the cathode and extracted or accelerated to form a primary electron beam 204 that forms a primary beam crossover 202 (virtual or real). Primary electron beam 204 can be visualized as being emitted from primary beam crossover 202.

In some embodiments, the electron emitter, condenser lens 226, objective lens assembly 232, beam-limiting aperture array 235, and electron detector 244 may be aligned with a primary optical axis 201 of apparatus 40. In some embodiments, electron detector 244 may be placed off primary optical axis 201, along a secondary optical axis (not shown).

Objective lens assembly 232, in some embodiments, may comprise a modified swing objective retarding immersion lens (SORIL), which includes a magnetic lens body 232a, a control electrode 232b, a deflector 232c (or more than one deflectors), an exciting coil 232d, and a pole piece 232e. In a general imaging process, primary electron beam 204 emanating from the tip of cathode 203 is accelerated by an accelerating voltage applied to anode 220. A portion of primary electron beam 204 passes through gun aperture 222, and an aperture of Coulomb aperture array 224, and is focused by condenser lens 226 so as to fully or partially pass through an aperture of beam-limiting aperture array 235. The electrons passing through the aperture of beam-limiting aperture array 235 may be focused to form a probe spot on the surface of sample 250 by the modified SORIL lens and deflected to scan the surface of sample 250 by deflector 232c. Secondary electrons emanated from the sample surface may be collected by electron detector 244 to form an image of the scanned area of interest.

In objective lens assembly 232, exciting coil 232d and pole piece 232e may generate a magnetic field that is leaked out through the gap between two ends of pole piece 232e and distributed in the area surrounding optical axis 201. A part of sample 250 being scanned by primary electron beam 204 can be immersed in the magnetic field and can be electrically charged, which, in turn, creates an electric field. The electric field may reduce the energy of impinging primary electron beam 204 near and on the surface of sample 250. Control electrode 232b, being electrically isolated from pole piece 232e, controls the electric field above and on sample 250 to reduce aberrations of objective lens assembly 232 and control focusing situation of signal electron beams for high detection efficiency. Deflector 232c may deflect primary electron beam 204 to facilitate beam scanning on the wafer. For example, in a scanning process, deflector 232c can be controlled to deflect primary electron beam 204, onto different locations of top surface of sample 250 at different time points, to provide data for image reconstruction for different parts of sample 250.

Backscattered electrons (BSEs) and secondary electrons (SEs) can be emitted from the part of sample 250 upon receiving primary electron beam 204. Electron detector 244 may capture the BSEs and SEs and generate one or more images of the sample based on the information collected from the captured signal electrons. If electron detector 244 is positioned off primary optical axis 201, a beam separator (not shown) can direct the BSEs and SEs to a sensor surface of electron detector 244. The detected signal electron beams can form corresponding secondary electron beam spots on the sensor surface of electron detector 244. Electron detector 244 can generate signals (e.g., voltages, currents) that represent the intensities of the received signal electron beam spots, and provide the signals to a processing system, such as controller 50. The intensity of secondary or backscattered electron beams, and the resultant beam spots, can vary according to the external or internal structure of sample 250. Moreover, as discussed above, primary electron beam 204 can be deflected onto different locations of the top surface of sample 250 to generate secondary or backscattered signal electron beams (and the resultant beam spots) of different intensities. Therefore, by mapping the intensities of the signal electron beam spots with the locations of primary electron beam 204 on sample 250, the processing system can reconstruct an image of sample 250 that reflects the internal or external structures of sample 250.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detector 244 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detector 244 and may construct an image. The image acquirer may thus acquire images of regions of sample 250. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, controller 50 may include measurement circuitries (e.g., analog-to-digital converters) to obtain a distribution of the detected secondary electrons. The electron distribution data collected during a detection time window, in combination with corresponding scan path data of a primary beam 204 incident on the sample (e.g., a wafer) surface, can be used to reconstruct images of the wafer structures under inspection. The reconstructed images can be used to reveal various features of the internal or external structures of sample 250, and thereby can be used to reveal any defects that may exist in the wafer.

Figure 2B:
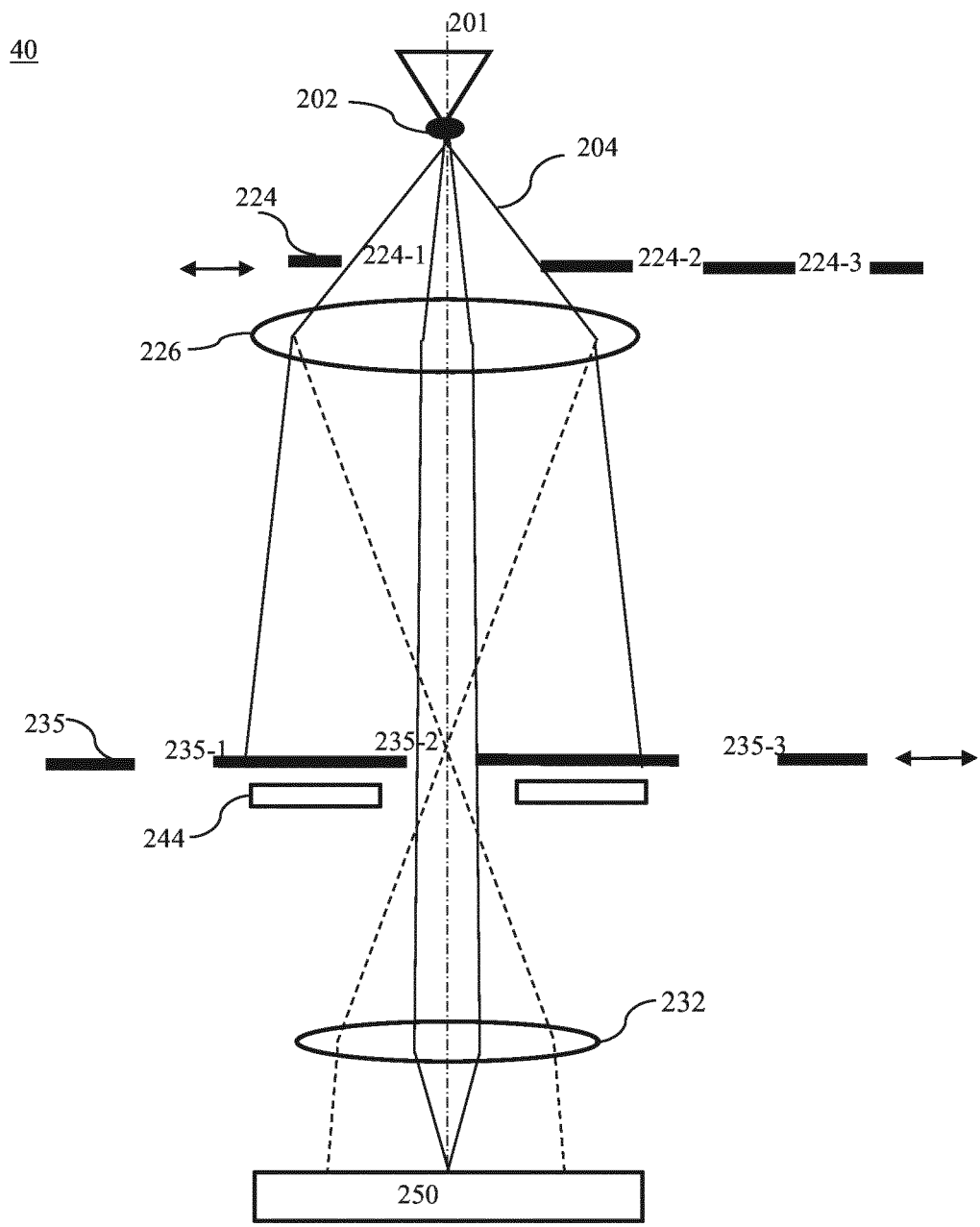

In some embodiments, controller 50 may control operation and adjustment of excitation of condenser lens 226. Controller 50 may adjust the electrical excitation of condenser lens 226 based on the mode of operation selected. As shown in FIG. 2B, for example, in flooding mode, condenser lens 226 may be electrically excited by applying an electrical signal such that the incident primary electron beam 204 may be strongly focused to form a cross over at or near aperture 235-2 of beam-limiting aperture array 235. In inspection mode, however, an electrical signal may be applied to condenser lens 226 such that the incident primary electron beam 204 may be weakly focused to allow a small portion of primary electron beam 204 pass through the aperture of beam-limiting aperture array 235 and is focused on sample 250 by objective lens 232.

Figure 3:
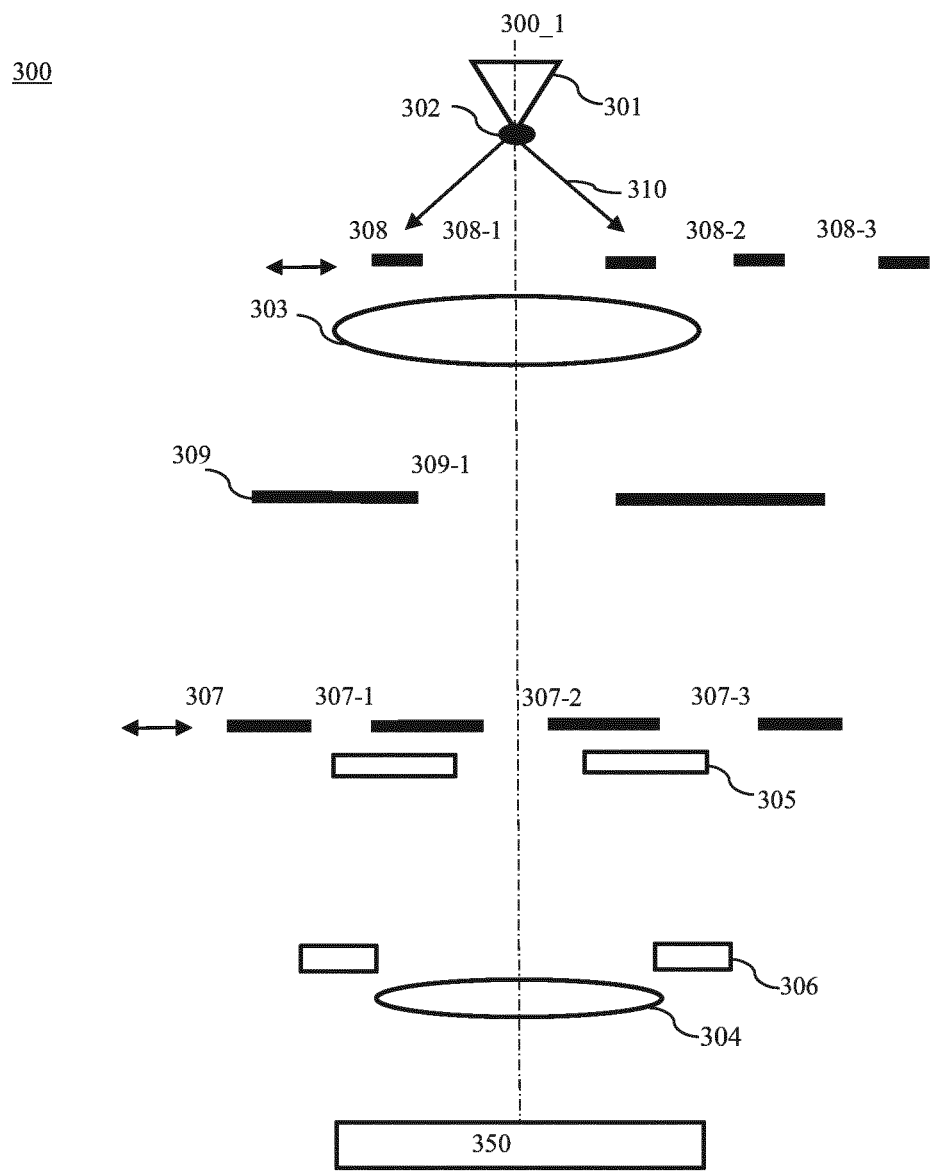
FIG. 3 is a schematic diagram illustrating an exemplary configuration of an electron beam tool in a single-beam apparatus, consistent with embodiments of the present disclosure.

Reference is now made to FIG. 3, which illustrates an exemplary configuration of electron beam tool 300 in a single-beam inspection apparatus, consistent with embodiments of the present disclosure. Electron beam tool 300 may comprise an electron source 301, a Coulomb aperture array 308, a condenser lens 303, a current-limiting aperture plate 309, a beam-limiting aperture array 307, a secondary electron detector 305, a scanning deflection unit 306, and an objective lens assembly 304. It is to be appreciated that relevant components may be added or omitted or reordered, as appropriate.

In some embodiments, electron source 301 may be configured to emit primary electrons from a cathode and extracted to form a primary electron beam 310 that emanates from a primary beam crossover (virtual or real) 302. In some embodiments, primary electron beam 310 can be visualized as being emitted from primary beam crossover 302 along primary optical axis 300_1. In some embodiments, one or more elements of electron beam tool 300 may be aligned with primary optical axis 300_1.

With reference to FIG. 3, Coulomb aperture array 308 may be positioned immediately downstream of electron source 301. As used in the context of this disclosure, "downstream" refers to a position of an element along the path of primary electron beam 310 starting from electron source 301, and "immediately downstream" refers to a position of a second element along the path of primary electron beam 310 such that there are no other elements between the first and the second element. For example, as illustrated in FIG. 3, Coulomb aperture array 308 may be positioned immediately downstream of electron source 301 such that there are no other electrical, optical, or electro-optical elements placed between electron source 301 and Coulomb aperture array 308. Such a configuration may be useful, among other things, in efficiently reducing the Coulomb effect. In some embodiments, an aperture plate (e.g., a gun aperture plate) (not shown) may be placed between electron source 301 and Coulomb aperture array 308 to block off peripheral electrons of primary electron beam 310 before being incident on Coulomb aperture array 308, to reduce Coulomb interaction effects.

In some embodiments, Coulomb aperture array 308 may comprise a beam-forming mechanism. Coulomb aperture array 308 may be configured to block peripheral electrons from primary electron beam 310 that may ultimately not be used to form a probe spot, and to reduce Coulomb interaction effects, among other things. In some embodiments, where Coulomb aperture array 308 is positioned immediately downstream of electron source 301, Coulomb aperture array 308 may be positioned as close as possible to electron source 301 to cut off electrons at an early stage, to further reduce Coulomb interaction effects.

Coulomb aperture array 308 may comprise a plurality of coulomb apertures 308-1, 308-2, and 308-3. As shown in FIG. 3, apertures 308-1, 308-2, and 308-3 may be dissimilar in size. In some embodiments, at least two apertures of Coulomb aperture array 308 are dissimilar in size. A larger aperture such as aperture 308-1 may allow more electrons to pass through, therefore forming an electron beam (e.g., primary electron beam 310) having a large beam current. A smaller aperture such as 308-2 or 308-3 may block more peripheral electrons emanated from electron source 301, therefore forming an electron beam with smaller beam current. Although, Coulomb aperture array 308 in FIG. 3 shows three apertures, it is to be appreciated that Coulomb aperture array 308 may comprise one or more apertures, as appropriate.

In some embodiments, Coulomb aperture array 308 may be disposed downstream or immediately downstream of electron source 301 and orthogonal to primary optical axis 300_1 and can be movable to align different apertures thereof with primary electron beam 310. Coulomb aperture array 308 may be disposed on a plane perpendicular or substantially perpendicular to primary optical axis 300_1. In some embodiments, the position of Coulomb aperture array 308 may be adjusted in the X- or Y-axis such that a desired aperture (e.g., aperture 308-1, 308-2, or 308-3) may be aligned with and perpendicular to primary optical axis 300_1. In some embodiments, the position of Coulomb aperture array 308 may be adjusted along primary optical axis 300_1 to be closer to or further away from electron source 301.

In some embodiments, an aperture of Coulomb aperture array 308 through which at least a portion of the electrons of primary electron beam 310 may pass through, is determined based on the mode of operation. For example, in flooding mode, a larger aperture, such as aperture 308-1, may be used to form the beam having large beam current by allowing more electrons to pass through, ultimately resulting in a larger beam spot. In some embodiments, in the inspection mode, any one of the apertures 308-1, 308-2, or 308-3 may be used to form the primary electron beam illuminating condenser lens 303, based on the desired inspection resolution and the beam current. For high inspection resolution and sensitivity, it may be desirable to use smaller apertures, such as 308-2 or 308-3, due to the limited number of electrons that may be allowed to pass through the aperture and resultantly reduce the Coulomb interaction effects. However, in some embodiments, switching from aperture 308-1 in flooding mode to aperture 308-2 or 308-3 in inspection mode may not be desirable due to the time consumed, among other things, thereby negatively affecting the inspection throughput.

In some embodiments, as shown in FIG. 3, the geometric center of a desired aperture (e.g., aperture 308-1, 308-2, or 308-3) may be aligned with primary optical axis 300_1. In some embodiments, switching the aperture from, for example, 308-1 to 308-2 or 308-1 to 308-3, may include aligning the geometric center of the aperture in use with primary optical axis 300_1.

In some embodiments, condenser lens 303 may be substantially similar to condenser lens 226 of FIG. 2A and may perform similar functions. In some embodiments, condenser lens 303 may be configured to receive the portion of primary electron beam 310 allowed to pass through the selected aperture of Coulomb aperture array 308. In some embodiments, condenser lens 303 may be configured to focus the received portion of primary electron beam 310 based on the selected mode of operation. Condenser lens 303 may comprise an electrostatic, electromagnetic, or a compound electromagnetic lens, among others. In some embodiments, condenser lens 303 may be electrically or communicatively coupled with a controller, such as controller 50 illustrated in FIG. 2A. Controller 50 may apply an electrical excitation signal to condenser lens 303 to adjust the focusing power of condenser lens 303 based on the selected mode of operation.

Figure 4A:
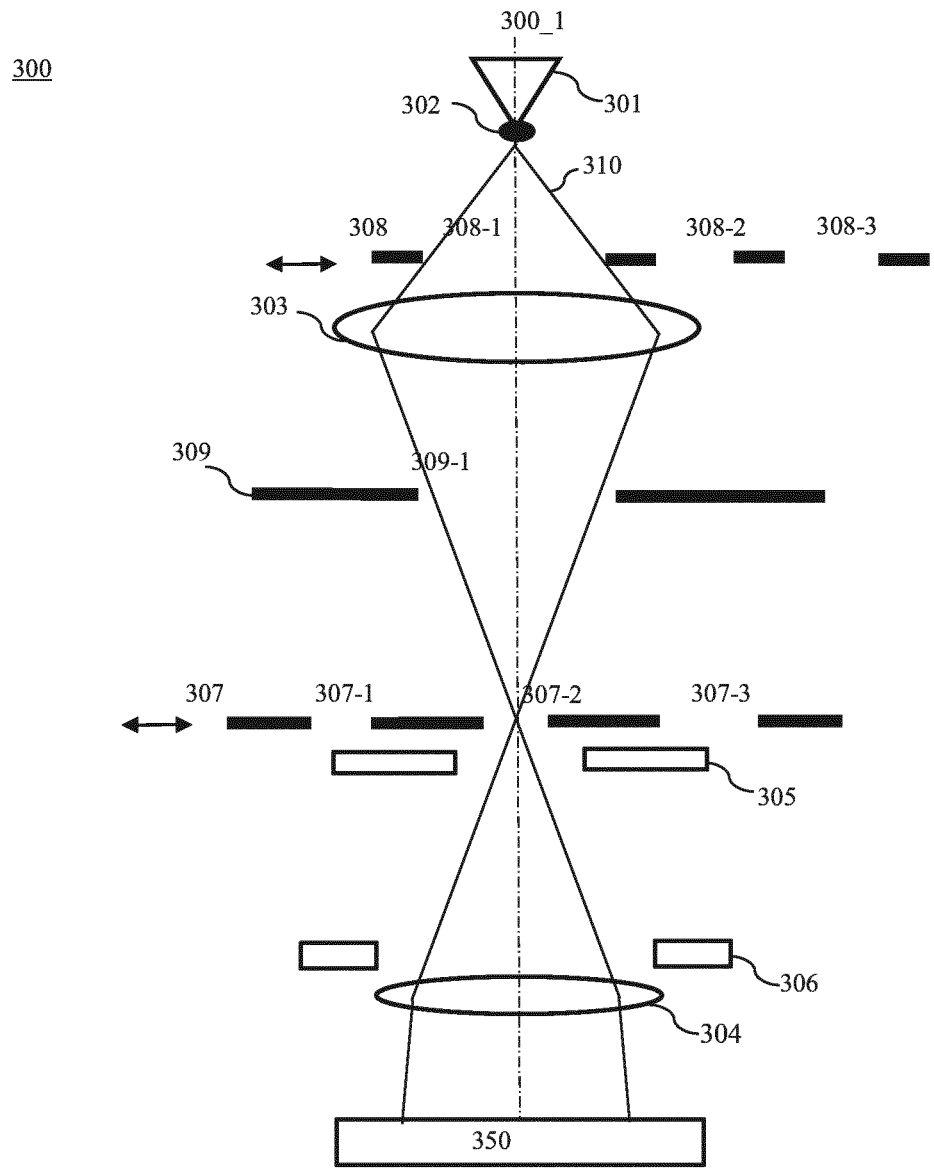
FIGS. 4A and 4B are schematic diagrams illustrating an exemplary configuration of an electron beam tool and the electron beam paths in a flooding mode and an inspection mode of the single-beam apparatus, respectively, in FIG. 3, consistent with embodiments of the present disclosure.

Reference is now made to FIG. 4A, which illustrates an exemplary configuration of the electron beam tool 300 and electron beam path in the flooding mode. In the flooding mode shown in FIG. 4A, controller 50 may apply an electrical signal to condenser lens 303 such that electrons of primary electron beam 310 fully or partially passing through a selected aperture of Coulomb aperture array 308 may be focused to pass through an in-use aperture (e.g., aperture 307-2) of beam-limiting aperture array 307. The in-use aperture may have a desired size for the inspection mode such that aperture 307-2 may be used for flooding and inspection modes to reduce the time needed to select and align apertures of beam-limiting aperture array 307 between different modes of operation. In some embodiments, the electrons may form a crossover in the in-use aperture along a crossover plane. The crossover plane may coincide with the plane in which beam-limiting aperture array 307 is disposed. In some embodiments, the position of the plane in which beam-limiting aperture array 307 is disposed may be adjustable along primary optical axis 300_1 to coincide with the crossover plane. The in-use aperture 309-1 of current-limiting aperture plate 309 may be configured to allow the electrons passing through the in-use apertures of Coulomb aperture array 308 and beam-limiting aperture array 307. In some embodiments, controller 50 may apply an electrical signal to objective lens 304, and the electrical signal may also be used in the inspection mode. Objective lens 304 may be configured to partially focus the electrons passing through the in-use apertures of Coulomb aperture array 308 and beam-limiting aperture array 307 onto sample 350 and form a large beam spot thereon and flood sample 350 with electrons.

Figure 4B:
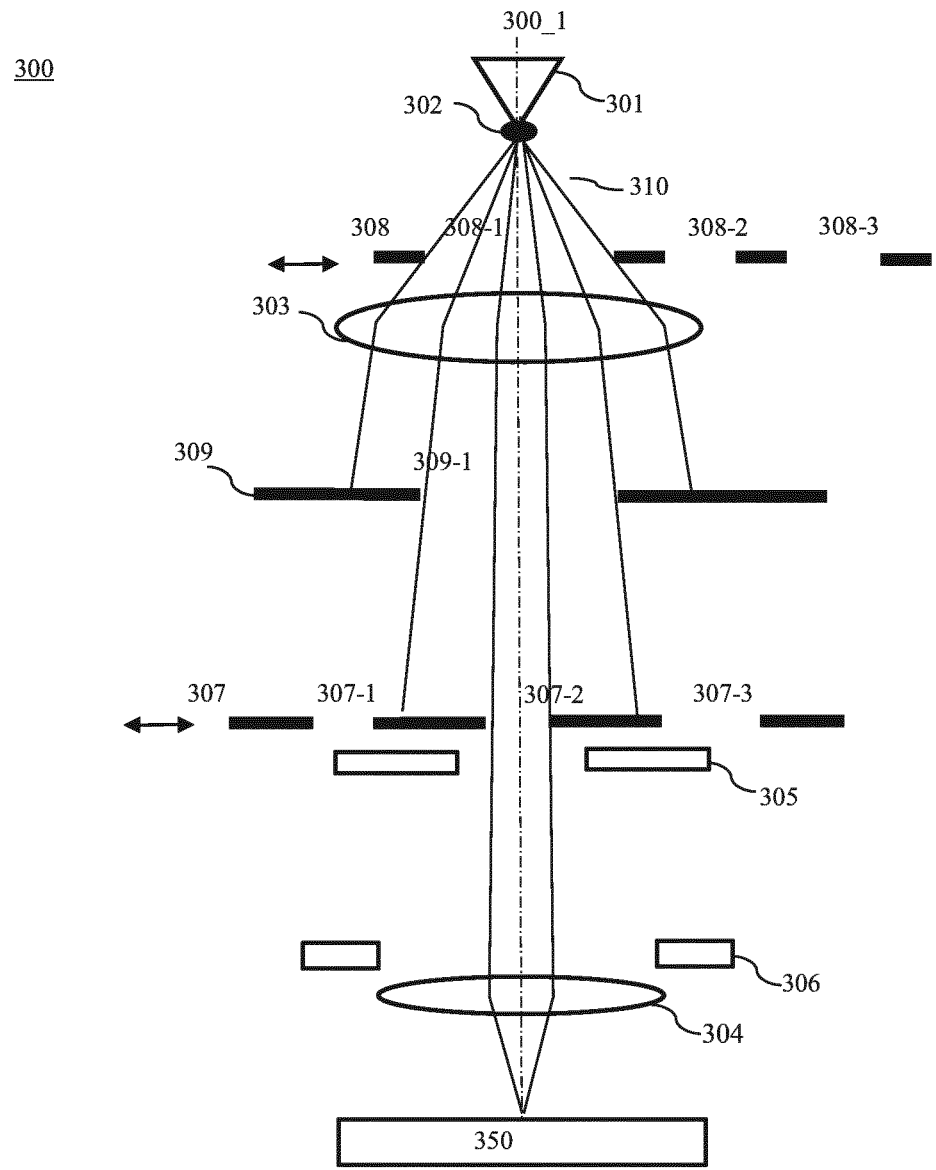

In the inspection mode shown in FIG. 4B, controller 50 may apply an electrical signal to condenser lens 303 such that a desired portion of primary electron beam 310 may pass through the in-use aperture 307-2 of beam-limiting aperture 307. The desired portion then may be fully focused by objective lens 304 to form a small probe spot on the surface of sample 350. In some embodiments, controller 50 may apply an electrical signal to objective lens 304, and the electrical signal may also be used in the flooding mode. In the inspection mode, however, peripheral electrons passing through the in-use aperture 308-1 of Coulomb aperture array 308 may be mostly blocked off by the in-use aperture 309-1 of current-limiting aperture plate 309. Cutting off the peripheral electrons may reduce the Coulomb effect between current-limiting aperture plate 309 and beam-limiting aperture array 307, and therefore may improve image resolution without switching apertures of Coulomb aperture array 308 between the flooding mode and the inspection mode, while improving the inspection throughput.

Detection of voltage contrast defects may include, among other things, highlighting a defect by pre-charging or sample flooding in the flooding mode of operation, followed by detecting the defect by high resolution imaging in the inspection mode of operation. In some embodiments, the size of the probe spot in inspection mode may be smaller than the beam spot in flooding mode to provide higher resolution and inspection sensitivity. As mentioned earlier, though the probe size may be reduced by reducing the aperture size of Coulomb aperture array 308, doing so may negatively impact the inspection throughput. Therefore, it may be desirable to reduce the probe size in the inspection mode while maintaining the inspection throughput.

In some embodiments, current-limiting aperture plate 309 may be disposed between condenser lens 303 and beam-limiting aperture array 307. The position of current-limiting aperture plate 309 and the size of in-use aperture 309-1 may be selected to block peripheral electrons as much as possible in the inspection mode, while allowing substantially all electrons in the flooding mode, and consequently reducing Coulomb effect in the inspection mode and improving inspection throughput. In some embodiments, current-limiting aperture plate 309 may be disposed downstream or immediately downstream of condenser lens 303 and orthogonal to primary optical axis 300_1, and may use an aperture having a larger opening. In some embodiments, current-limiting aperture plate 309 may be disposed along a plane orthogonal to primary optical axis 300_1 such that the distance between current-limiting aperture plate 309 and condenser lens 303 is substantially equal to the distance between current-limiting aperture plate 309 and beam-limiting aperture array 307, and use an aperture with a smaller opening.

In some embodiments, the aperture size and the position of current-limiting aperture plate 309 may determine the efficiency of reducing Coulomb effect in the inspection mode. For example, if current-limiting aperture plate 309 is placed closer to condenser lens 303, a larger aperture size may be used. In this case, though the aperture can block peripheral electrons of primary electron beam 310 earlier in the inspection mode, the number of peripheral electrons blocked may be lower. In some embodiments, the aperture size or the position of current-limiting aperture plate 309 may be changed to optimize the reduction of Coulomb effect in the inspection mode, while the number of electrons passing through current-limiting aperture plate 309 and beam-limiting aperture array 307 may be unaffected in the flooding mode. Accordingly, current-limiting aperture plate 309 may comprise more than one aperture (e.g., 409-1 and 409-2) as shown in FIG. 5, or may be movable along primary optical axis 500_1 as shown in FIG. 6, or may comprise more than one aperture (e.g., 509-1 and 509-2) and be movable along the primary optical axis 600_1 as shown in FIG. 7.

Figure 5:
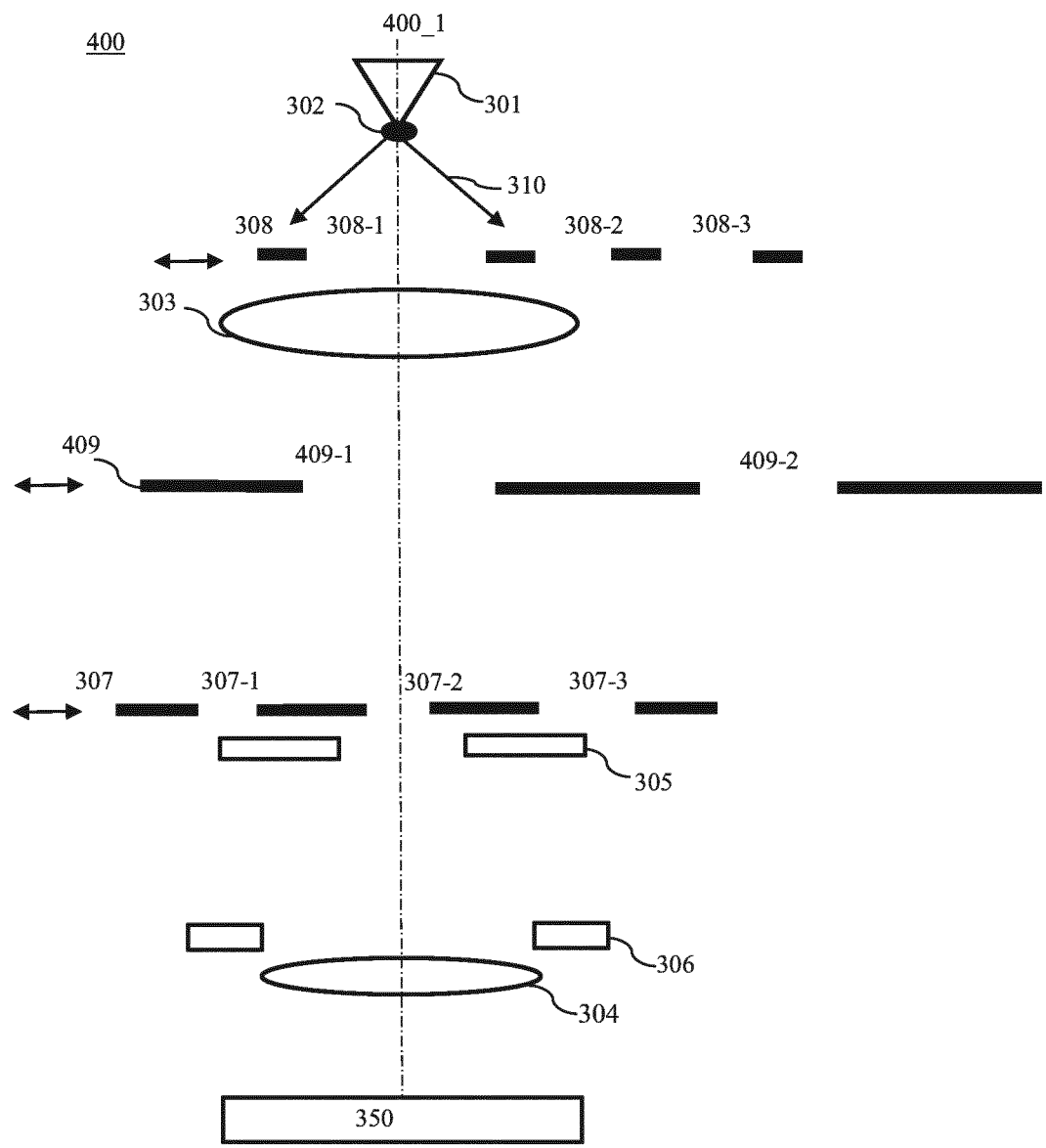
FIGS. 5-7 are schematic diagrams illustrating exemplary configurations of an electron beam tool and the electron beam paths in an inspection mode of the single-beam apparatus, consistent with embodiments of the present disclosure.

In some embodiments, for example as shown in FIG. 5, current-limiting aperture plate 409 may comprise two or more apertures 409-1 and 409-2, and the apertures may be dissimilar in size, pitch, and shape. Current-limiting aperture plate 409 may be positioned along a plane orthogonal or substantially orthogonal to primary optical axis 400_1 such that the geometric center of a selected aperture of current-limiting aperture plate 409 is aligned with primary optical axis 400_1.

Figure 6:
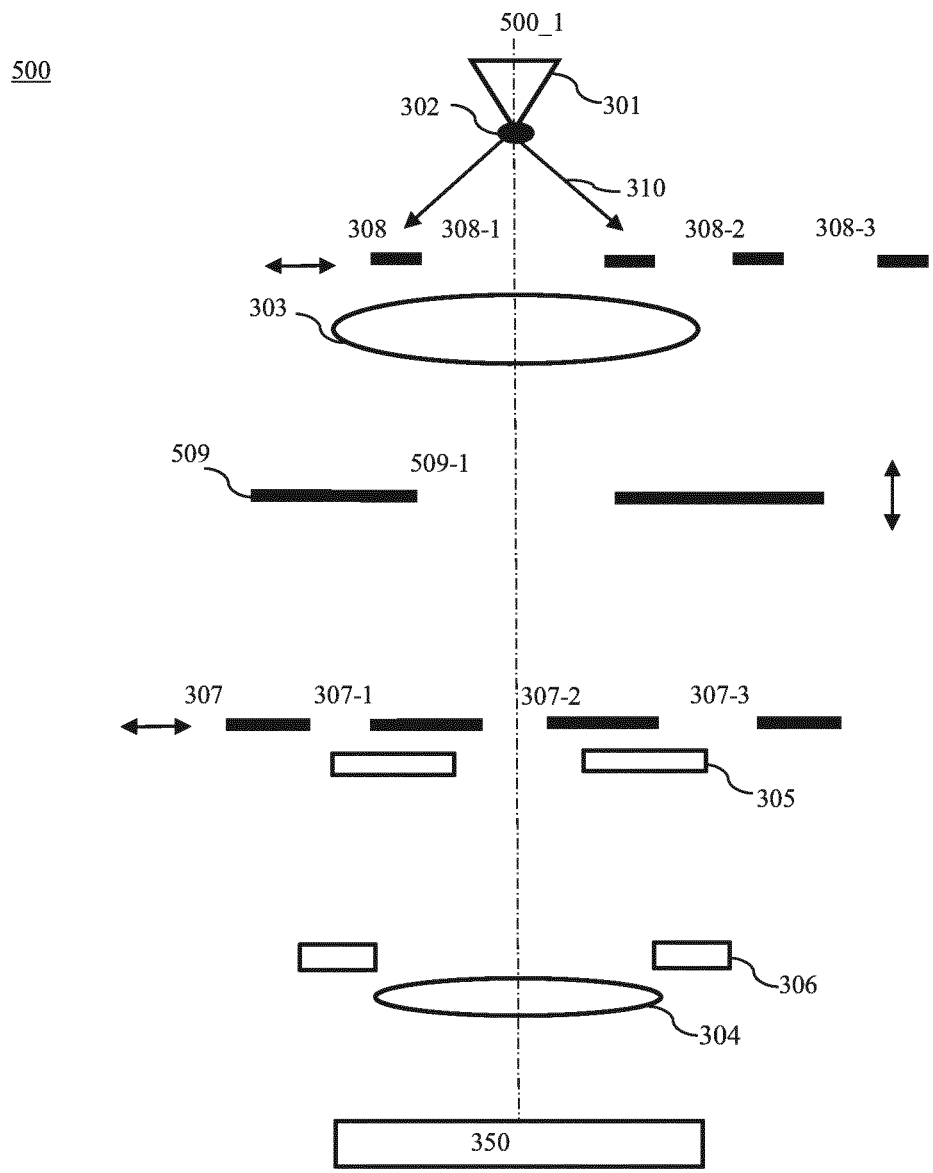

In some embodiments, for example in FIG. 6, the position of current-limiting aperture plate 509 may be adjustable along primary optical axis 500_1 based on, but is not limited to, the size of primary electron beam 310, the focusing power of condenser lens 303, the desired beam current in the flooding mode, etc. For example, in the flooding mode, current-limiting aperture plate 509 may be disposed at a first distance from condenser lens 303 along primary optical axis 500_1 such that it allows an electron beam having a desired beam current to pass through and to be incident on objective lens assembly 304, and in the inspection mode, placing current-limiting aperture plate 509 at the same position as in the flooding mode may significantly reduce the Coulomb interaction effect.

Figure 7:
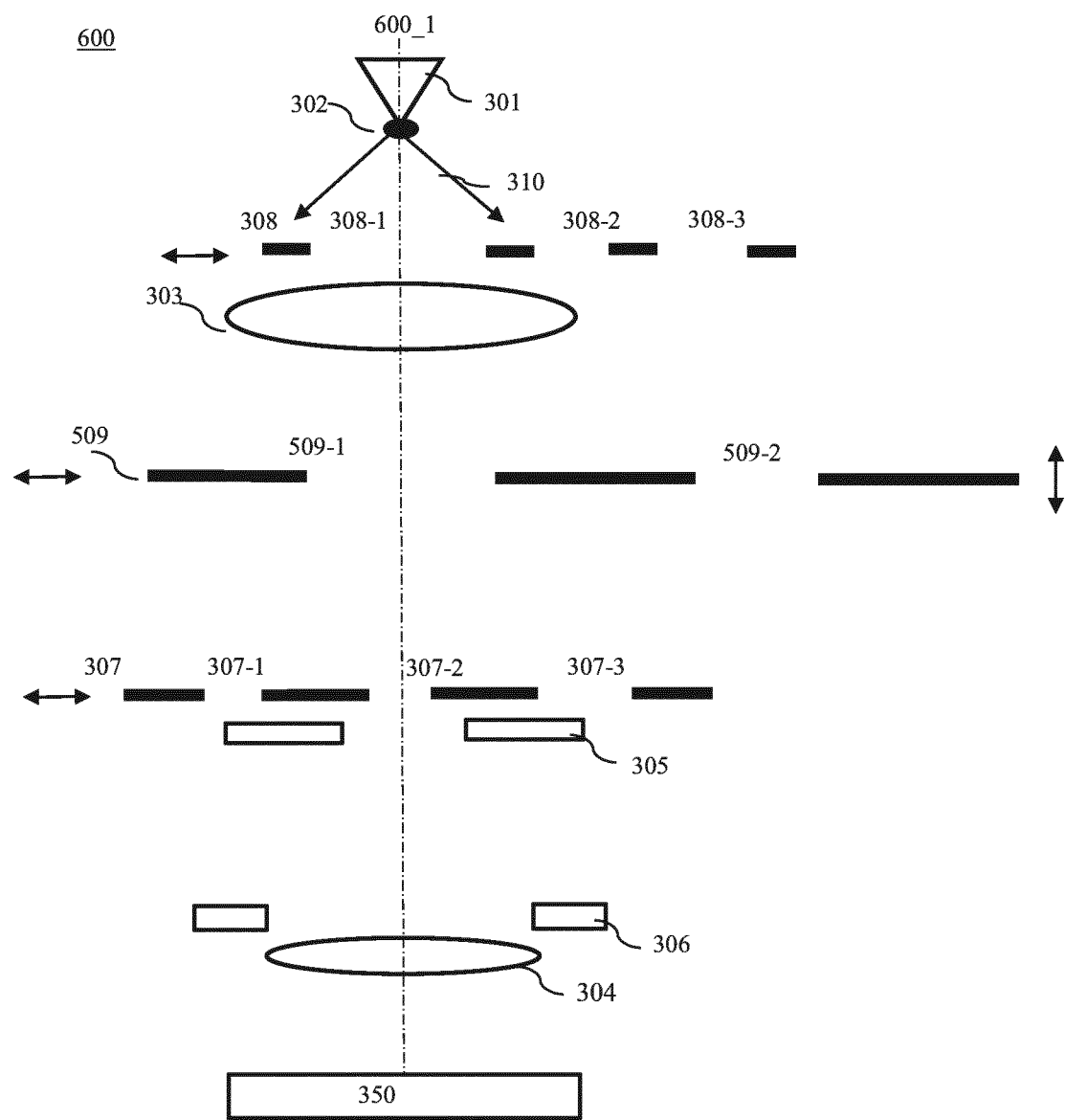

In some embodiments, for example in FIG. 7, current-limiting aperture array 609 may comprise two or more apertures and the position of limiting aperture plate 609 along primary optical axis 600_1 may be adjusted to minimize or reduce Coulomb interaction effects, thereby enhancing imaging resolution in the inspection mode of operation. One of the several problems that may be encountered while adjusting the size of a current-limiting aperture may be the time consumed to perform the operation of, including but not limiting, moving the current-limiting aperture plate (e.g., current-limiting aperture plate 509), aligning the current-limiting aperture with primary optical axis 600_1, thus negatively affecting the inspection throughput. In some embodiments, the size of current-limiting aperture 509-1 and the position of current-limiting aperture plate 509 along primary optical axis 600_1 may be fixed regardless of the mode of operation.

Referring back to FIG. 3, beam-limiting aperture array 307 may be configured to allow substantially all electrons of the electron beam from condenser lens 303 in the flooding mode and to block off the peripheral electrons to achieve a desired probe current on sample 350 in the inspection mode. The size of the probe spot on sample 350 may be determined by the size of the selected aperture of beam-limiting aperture array 307.

In some embodiments, beam-limiting aperture array 307 may comprise beam-limiting apertures 307-1, 307-2, and 307-3. Although FIG. 3 shows at least two beam-limiting apertures (e.g., 307-2 and 307-3) of dissimilar size, it is to be appreciated that all beam-limiting apertures may be of similar size. Beam-limiting aperture array 307 may be disposed downstream or immediately downstream of current-limiting aperture plate 309 and orthogonal to primary optical axis 300_1. In some embodiments, beam-limiting aperture array 307 may be disposed between current-limiting aperture plate 309 and secondary electron detector 305. The position of beam-limiting aperture array 307 may be adjustable along the X-, Y-, or Z-axis. In some embodiments, the position of beam-limiting aperture array 307 may be adjusted in the X-, or Y-axis so that a selected beam-limiting aperture may be aligned with primary optical axis 300_1. In some embodiments, a beam-limiting aperture 307-2, for example, may be aligned such that the geometric center of beam-limiting aperture 307-2 may be aligned with primary optical axis 300_1. The position of beam-limiting aperture array 307 may be adjusted along the Z-axis, parallel to primary optical axis 300_1 to adjust the distance between beam-limiting aperture array 307 and current-limiting aperture plate 309. In some embodiments, the distance between beam-limiting aperture array 307 and current-limiting aperture plate 309 may be adjusted to adjust the Coulomb interaction effects.

In existing voltage contrast defect detection and inspection tools, some of the challenges encountered include, among other things, limitations in the allowable size of beam-limiting aperture array 307 and a limited range of movement for beam-limiting aperture array 307. In addition, beam-limiting apertures of beam-limiting aperture array 307 may be positioned farther apart from each other to block a desired portion of peripheral electrons of the electron beam from condenser lens 303, thus limiting the number of beam-limiting apertures that may be employed. Therefore, it may be desirable to provide a current-limiting aperture such as in current-limiting aperture plate 309 between condenser lens 303 and beam-limiting aperture array 307 to block peripheral electrons and to reduce the size of the electron beam incident on beam-limiting aperture array 307 in the inspection mode, while allowing substantially all electrons of primary electron beam 310 to pass through in the flooding mode. Placing current-limiting aperture plate 309 between condenser lens 303 and beam-limiting aperture array 307 may further allow providing more beam-limiting apertures with a reduced pitch.

Electron beam tool 300 may further include deflection scanning unit 306. In some embodiments, deflection scanning unit 306 may be positioned inside a primary projection optical system (not illustrated in FIG. 3). In the inspection mode, deflection scanning unit 306 may be configured to deflect primary beam 310 to scan the surface of sample 350. Objective lens assembly 304 and secondary electron detector 305 may be substantially similar to objective lens assembly 232 and electron detector 244 of FIG. 2A, respectively, and may perform substantially similar functions.

In some embodiments, Coulomb aperture array 308 may be adjusted to switch from using large aperture 308-1 to smaller apertures 308-2 or 308-3 to enhance inspection resolution and inspection sensitivity or defect detectability in the inspection mode.

Figure 8:
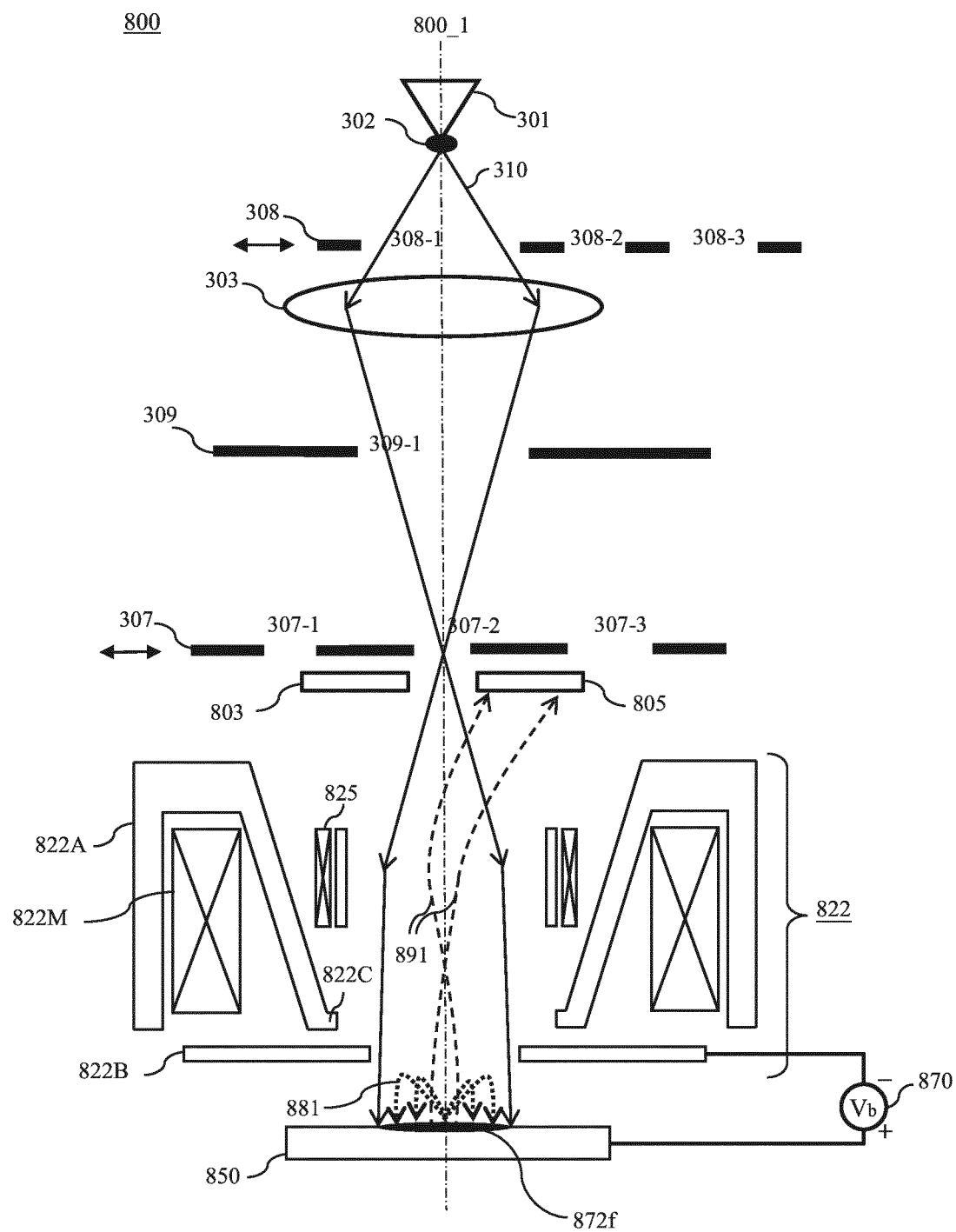
FIG. 8 is a schematic diagram illustrating an exemplary configuration of an electron beam tool in a single-beam apparatus, consistent with embodiments of the present disclosure.

Reference is now made to FIG. 8, which illustrates an exemplary configuration of an electron beam tool 800 in a single-beam apparatus, consistent with embodiments of the present disclosure. Electron beam tool 800 may comprise an electron source 301, a Coulomb aperture array 308, a condenser lens 303, a current-limiting aperture plate 309, a beam-limiting aperture array 307, an objective lens assembly 822, and a signal electron deflector 825. In some embodiments, electron beam tool 800 may further comprise multiple electron detectors, such as in-lens electron detectors 803 and 805. In some embodiments, the in-lens electron detector 803 and 805 may be coupled to a first and second channels of electron beam tool 800, respectively. In some embodiments, each channel may be optimized for different inspection characteristics. For example, in some embodiments, the first channel may be optimized for high-speed detection while the second channel may be optimized for high-resolution inspection.

As explained above with respect to FIG. 4A, when the apparatus operates in the flooding mode, condenser lens 303 may focus a primary electron beam 310 such that electrons of the primary electron beam 310 may pass through a selected aperture 308-1 of Coulomb aperture array 308 and an in-use aperture (e.g., aperture 307-2) of beam-limiting aperture array 307. In some embodiments, the electrons may form a crossover near the in-use aperture 307-2 along a crossover plane. The crossover plane may coincide with the plane in which beam-limiting aperture array 307 is disposed. An in-use aperture 309-1 of current-limiting aperture plate 309 may be configured to allow the electrons passing through the in-use apertures of Coulomb aperture array 308 and beam-limiting aperture array 307.

The electron beam tool 800 may comprise objective lens assembly 822 (e.g., the objective lens 304 of FIG. 4A). In some embodiments, objective lens assembly 822 may comprise a compound electromagnetic lens including a magnetic lens comprising an exciting coil 822M, a magnetic lens body 822A, and an inner pole piece 822C, and an electrostatic lens formed by the inner pole piece 822C (similar to pole piece 232e of FIG. 2) and a control electrode 822B (similar to control electrode 232b of FIG. 2), which work in conjunction to focus primary electron beam 310 at sample 850. When the apparatus operates in the flooding mode, objective lens assembly 822 may be configured to partially focus the primary electron beam 310 passing through the in-use apertures of Coulomb aperture array 308 and beam-limiting aperture array 307 onto a sample 850, and form a large flooding beam spot 872f on sample 850 to pre-charge a portion of the sample 850.

As described earlier with respect to FIG. 2A, interaction of electrons of primary electron beam 310 with sample 850 may generate signal electrons (e.g., signal electrons travel along paths 881 and 891). In some embodiments, the signal electrons may include SEs and BSEs. When the apparatus is operating in the flooding mode, the current of the primary electron beam 310 may reach a substantially high level (e.g., >2000 nA) and the electrons of primary electron beam 310 may be accelerated to have substantially high kinetic energy. Accordingly, the signal electrons generated during the flooding mode may reach to a substantially high level (e.g., roughly up to the similar level of the primary beam current, if yield is 1), and depending on the landing energy, the signal electrons will also have a substantially high kinetic energy, for example, from few keV up to the electron source emission energy. If these large amount of high-energy signal electrons hit electron detectors 803 and 805, the detector surface can be contaminated with the built-up carbonaceous materials that exist in vacuum and are bombarded by the high-energy and large amount of signal electrons, which may cause the detector aging over time. Furthermore, the electronic circuitry (e.g., a low-noise amplifier) that are connected to the detectors 803 and 805 may be damaged due to a surge current or overcurrent caused by the high-energy signal electrons.

To alleviate these potential issues during the flooding mode, in some embodiments, the electron beam tool 800 may comprise a detector protection mechanism that is configured to prevent the signal electrons from reaching the electron detector when the apparatus operates in the flooding mode.

In some embodiments, control electrode 822B may be placed to form an active energy filter between sample 850 and in-lens electron detectors 803 and 805. In some embodiments, control electrode 822B may be disposed between sample 850 and magnetic lens 822M of objective lens assembly 822. When control electrode 822B is biased to a voltage by power supply 870 with reference to sample 850, an electric field is generated between control electrode 822B and sample 850, resulting in an electrostatic potential barrier for the signal electrons. The electrostatic potential barrier blocks off signal electrons that have emission energies lower than a threshold energy level of the barrier. It is appreciated that an "active filter" means an electron filter using active components, such as an electrode generating an "active" electric field—in contrast to a "passive filter" that uses only passive elements.

For example, as shown in FIG. 8, control electrode 822B is biased negatively with reference to sample 850 such that the negatively charged signal electrons (e.g., the SEs on path 881) are reflected back to sample 850 because the SEs on path 881 do not have enough energy to pass through the energy barrier. Although signal electrons which have emission energies higher than the threshold energy level of the barrier (e.g., the BSEs on path 891) may overcome the energy barrier and propagate towards in-lens electron detector 805, these BSEs may not damage the detector 805 or the associated electronic circuitry because the yield of these BSEs is relatively low. For example, when the probe current of primary electron beam 310 in the flooding mode is within the range of 1000-2000 nA, resulting signal electrons may comprise mainly the SEs. Reflecting the SEs (e.g., electrons on path 881) back to the sample 850, therefore, may significantly reduce the number of total electrons reaching to the detector, thereby reducing the possibility of amplifier overcurrent or the detector contamination. Furthermore, the reflected SEs may assist the sample pre-charging process.

Figure 9A:
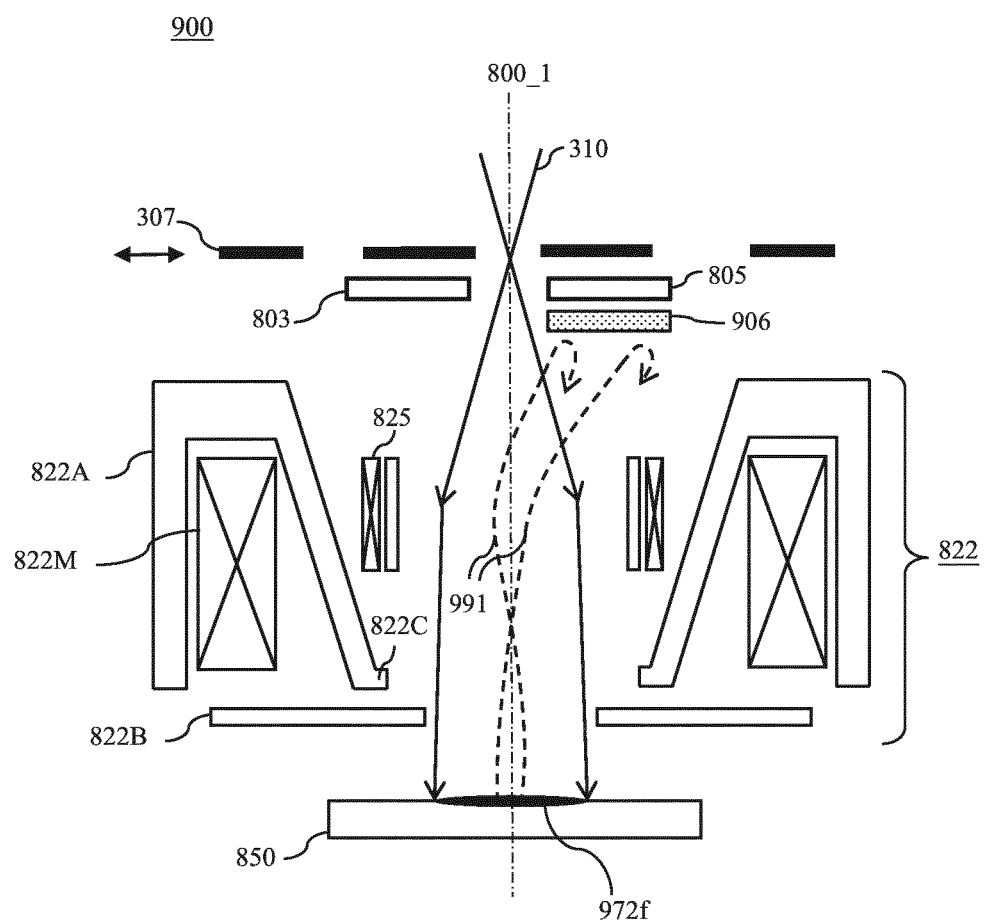
FIGS. 9A-9C are schematic diagrams illustrating an exemplary electron beam tool in a single-beam apparatus, consistent with embodiments of the present disclosure.
Figure 9B:
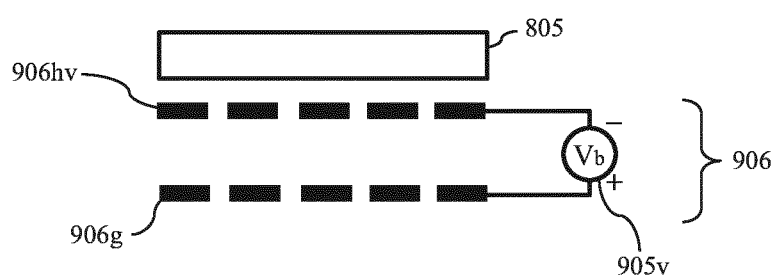
Figure 9C:
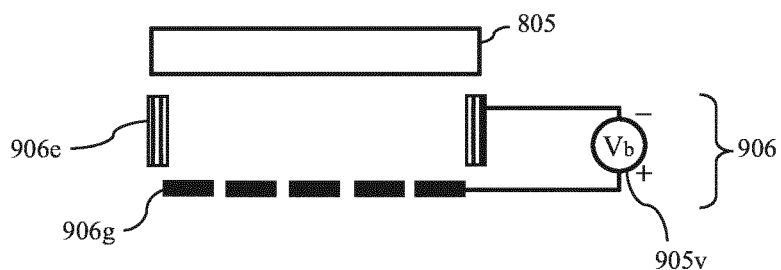

Reference is now made to FIGS. 9A-9C, which illustrate an exemplary electron beam tool 900 including another embodiment of an electron detector protector 906, consistent with embodiments of the present disclosure.

An active energy filter (such as the one shown in FIG. 8) generates an electric field that may influence the electrons in the primary electron beam 310. In some embodiments, it may be desired to protect the detectors while minimizing the influence on the primary electrons. Furthermore, in some embodiments, it may also be desired to maintain the primary beam condition (e.g., the strength of the magnetic field and the electric field applied to the primary electrons) unchanged between the flooding mode and the inspection mode to enable faster mode-switching. In comparison to the electron beam tool 800 of FIG. 8, the electron beam tool 900 comprises an active energy filter 906 disposed near in-lens electron detector 805. Active energy filter 906 may be configured to filter out signal electrons 991 in the flooding mode. When the apparatus operates in the inspection mode, the active energy filter 906 may be inactivated so that the signal electrons 991 can pass through the active energy filter 906 and be detected by the detector 805. As the energy filter 906 may be positioned away from the primary optical axis, the influence on the primary electron beams could be reduced compared to the electron beam tool 800.

The active energy filter 906, as shown in FIG. 9B, may comprise a high-voltage electrode 906$hv$ and a ground electrode 906$g$. The electrodes 906$hv$ and 906$g$ may be mesh-type electrodes. During the flooding mode, the high-voltage electrode 906$hv$ may be biased negatively with reference to the ground electrode 906$g$ to generate an electric field, such that the negatively charged signal electrons are reflected toward sample 850. In some embodiments, the bias voltage supplied by a power supply 905$v$ may be changed to adjust the energy barrier of the active energy filter 906. For example, the bias voltage can be increased to block all signal electrons including the BSEs and SEs; and decreased to block only signal electrons with low emission energy (e.g., SEs) while allowing the signal electrons with high emission energy (e.g., BSEs) to pass through to the detector 805.

In some embodiments, high-voltage electrode 906$hv$ and ground electrode 906$g$ may comprise mesh-like structures fabricated from an electrically conducting material, such as a metal, an alloy, a semiconductor, or a composite, among other things. The high-voltage electrode 906$hv$ and ground electrode 906$g$ may be disposed between objective lens assembly 822 and in-lens electron detector 805. In some embodiments, high-voltage electrode 906$hv$ and ground electrode 906$g$ may be disposed closer to in-lens electron detector 805 than objective lens assembly 822.

As shown in FIG. 9C, the active energy filter 906 may comprise a tube-electrode 906$e$ instead of a mesh-type structure. Similar to the mesh-type high-voltage electrode 906$hv$ in FIG. 9B, the tube-electrode 906$e$ may be biased negatively with reference to the ground electrode 906$g$ to generate an electric field.

Figure 10A:
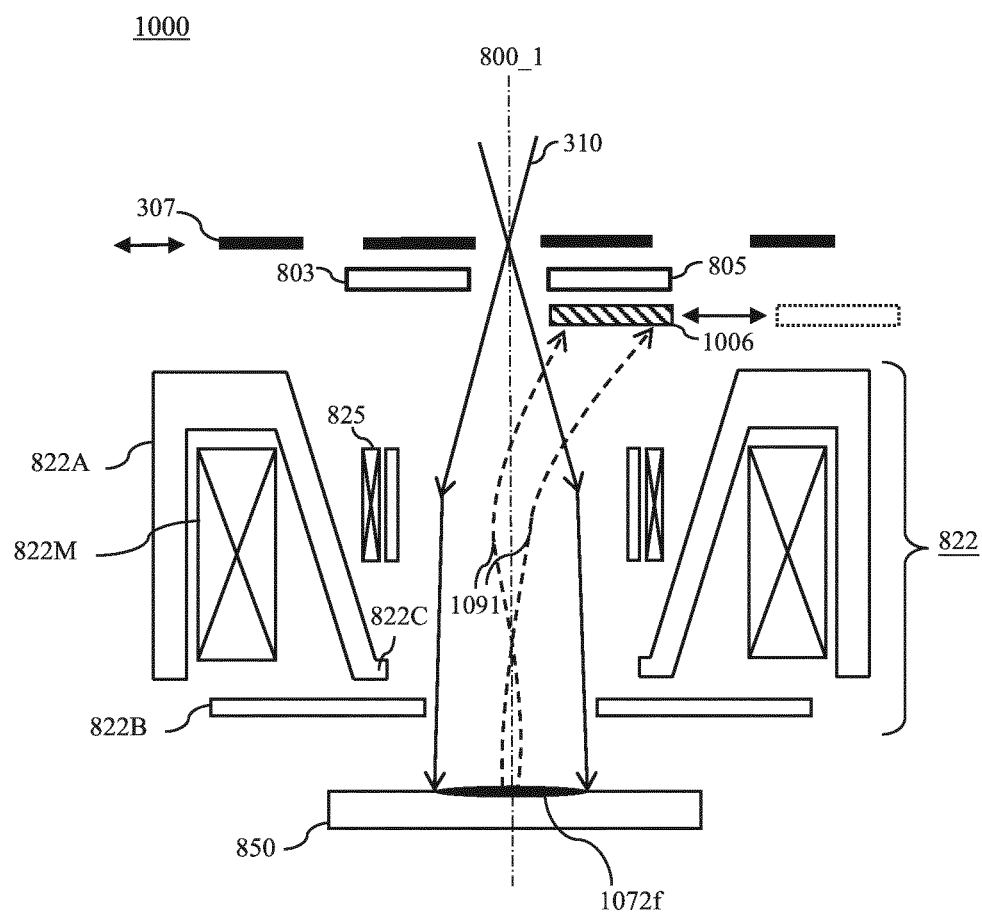
FIGS. 10A and 10B are schematic diagrams illustrating an exemplary electron beam tool operating in a flooding mode and an inspection mode, consistent with embodiments of the present disclosure.
Figure 10B:
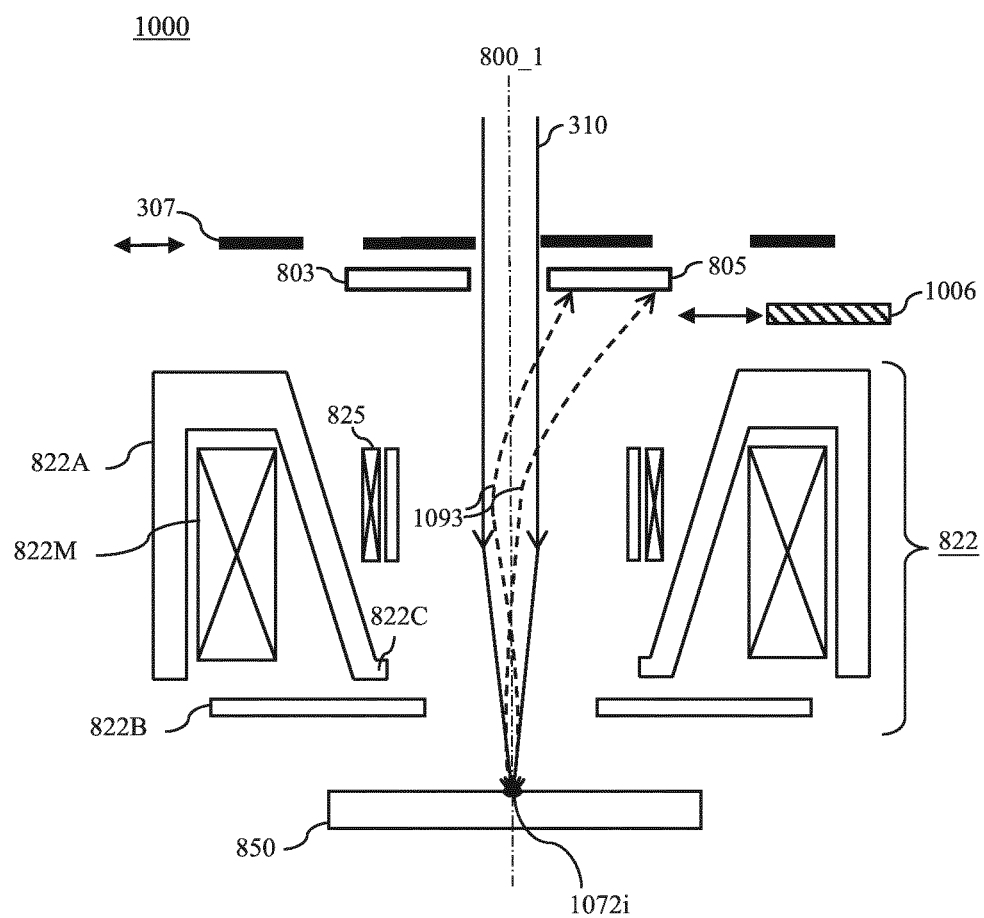

Reference is now made to FIGS. 10A-10B, which are schematic diagrams illustrating an exemplary electron beam tool 1000 operating in a flooding mode (FIG. 10A) and an inspection mode (FIG. 10B), consistent with embodiments of the present disclosure. The electron beam tool 1000 may operate in a substantially similar way as the electron beam tool 900 of FIG. 9A in that, when the tool is in the flooding mode, signal electrons 1091 are prevented from reaching an electron detector 805.

In some embodiments, the tool 1000 may comprise an electron stopper 1006 movable between a first position for the flooding mode (FIG. 10A) and a second position for the inspection mode (FIG. 10B). As shown in FIG. 10A, when the tool 1000 operates in the flooding mode, electron stopper 1006 may be positioned in the first position between a sample 850 and the electron detector 805, so that signal electrons 1091 generated from sample 850 are blocked by the electron stopper 1006. In some embodiments, electron stopper 1006 may be a plate made of materials capable of attenuating the energy of the incoming signal electrons. For example, electron stopper 1006 may comprise a semiconductor material (such as silicon nitride) or electric conduction material (such as aluminum film), which provide an attenuation capability while also providing a certain level of electric conductivity to discharge any charge that may build up within the electron stopper 1006 from the incidence of the signal electrons. In some embodiments, the electron stopper 1006 may be connected to a ground.

As shown in FIG. 10B, when the tool 1000 operates in the inspection mode, electron stopper 1006 may be positioned in the second position away from the paths on which signals electrons 1093 travel, so that the signal electrons 1093 may reach the surface of electron detector 805 for detection.

In some embodiments, the tool 1000 may use a moving mechanism (not shown) that may be capable of moving the electron stopper 1006 quickly between the first and the second position, such that the throughput of the overall system will not be affected by the mode switching. For example, in some embodiments, a piezoelectric motor can be used to move the electron stopper 1006.

Figure 11A:
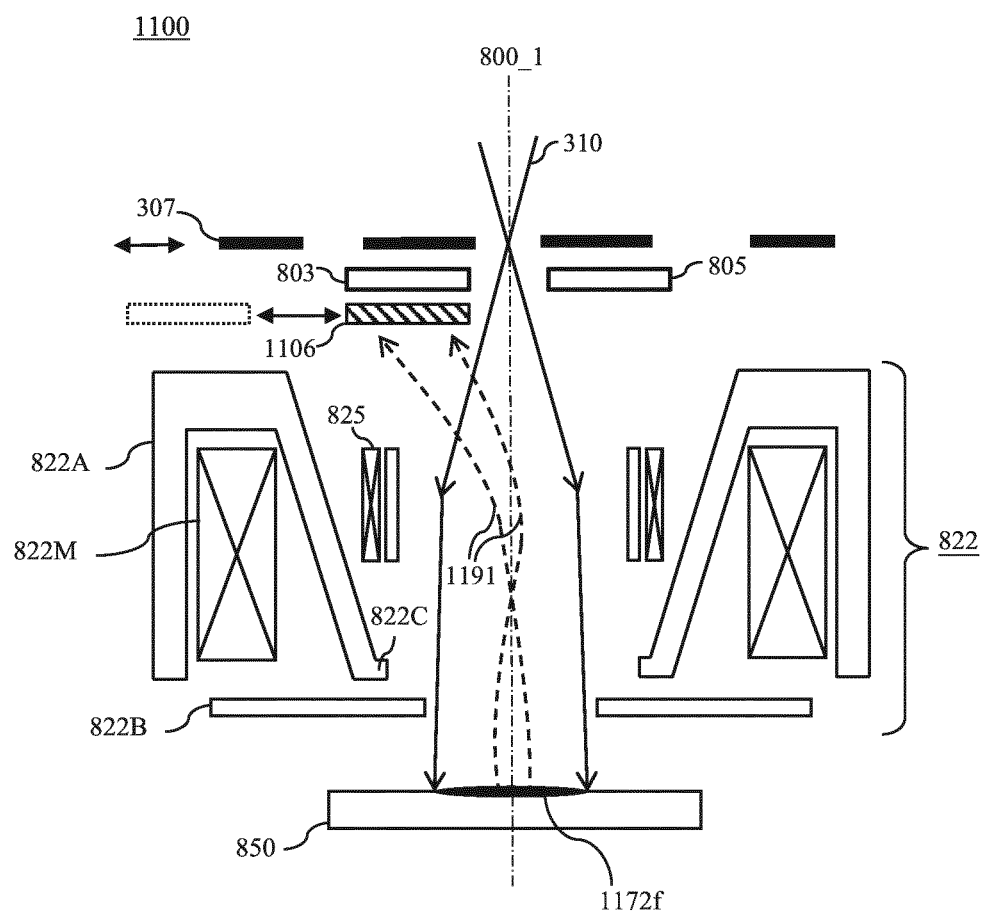
FIGS. 11A and 11B are schematic diagrams illustrating an exemplary electron beam tool operating in a flooding mode and an inspection mode, consistent with embodiments of the present disclosure.
Figure 11B:
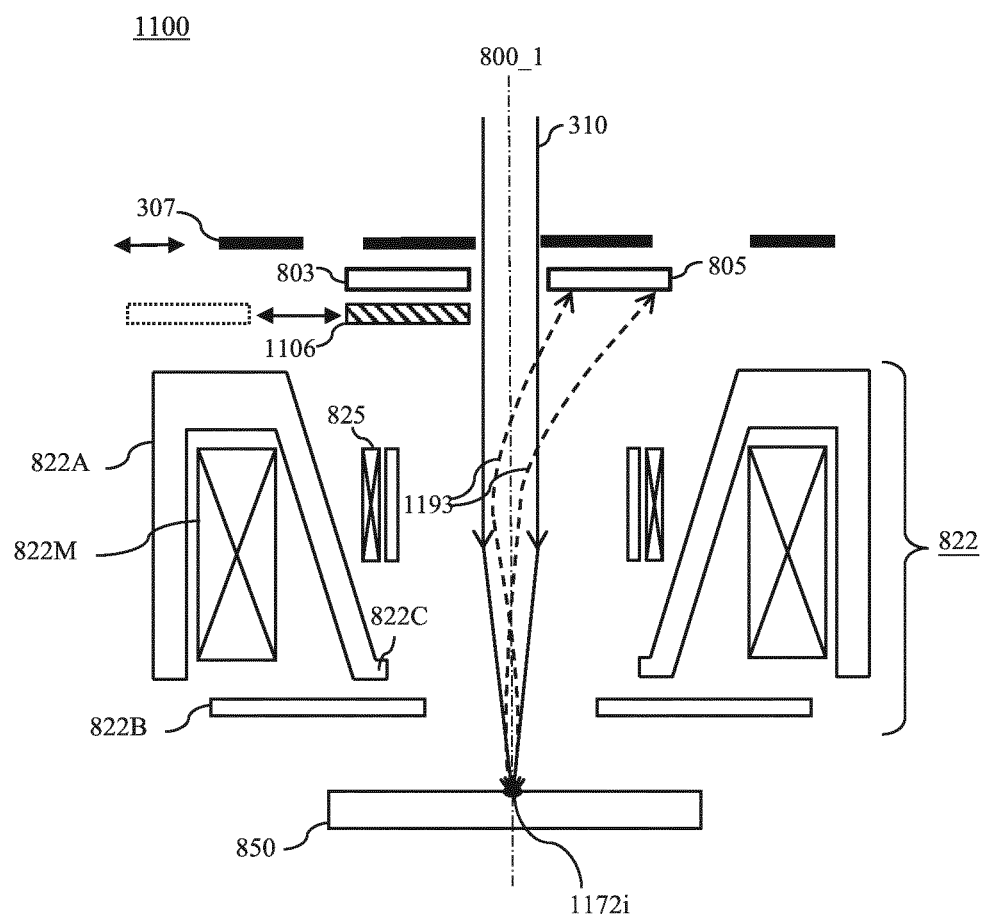

Reference is now made to FIGS. 11A-11B, which are schematic diagrams illustrating an exemplary electron beam tool 1100 operating in a flooding mode (FIG. 11A) and an inspection mode (FIG. 11B), consistent with embodiments of the present disclosure. In comparison to the electron beam tool 1000 of FIGS. 10A-10B, the electron beam tool 1100 may be configured to change the paths of signal electrons (e.g., between 1191 and 1193) based on the mode of operation, rather than moving an energy filter (e.g., electron stopper 1006 of FIGS. 10A-10B).

In the flooding mode, as shown in FIG. 11A, the signal electron deflector 825 may deflect signal electrons 1191 toward the electron detector 803 that is protected by an electron stopper 1106. In the inspection mode, as shown in FIG. 11B, the signal electron deflector 825 may deflect signal electrons 1193 toward the electron detector 805 for detection. In some embodiments, the signal electron deflector 825 may comprise Wien filter configured to generate an electric field and a magnetic field.

In some embodiments, the moving mechanism (not shown) for the electron stopper 1106 may be too slow that moving the filter in and out based on the operating mode may affect the overall system throughput negatively. In such cases, it may be desirable to place the electron stopper 1106 in front of the detector 803 (which is not in use), and reroute the signal electrons toward the detector 805 when the tool switches from the flooding mode to the inspection mode. Because the operating mode switching (between the flooding mode and the inspection mode) relies on rerouting of signal electrons (e.g., between 1191 and 1193) rather than placement of the electron stopper 1106, the tool 1100 can utilize a moving mechanism that is relatively slow, such as a stepper motor.

In some embodiments, the electron stopper 1106 may comprise an active filter, similar to the active energy filter 906 described with respect to FIGS. 9A-9C. In some embodiments, electron stopper 1106 may comprise a passive energy filter, similar to the electron stopper 1006 shown in FIGS. 10A-10B.

Figure 12A:
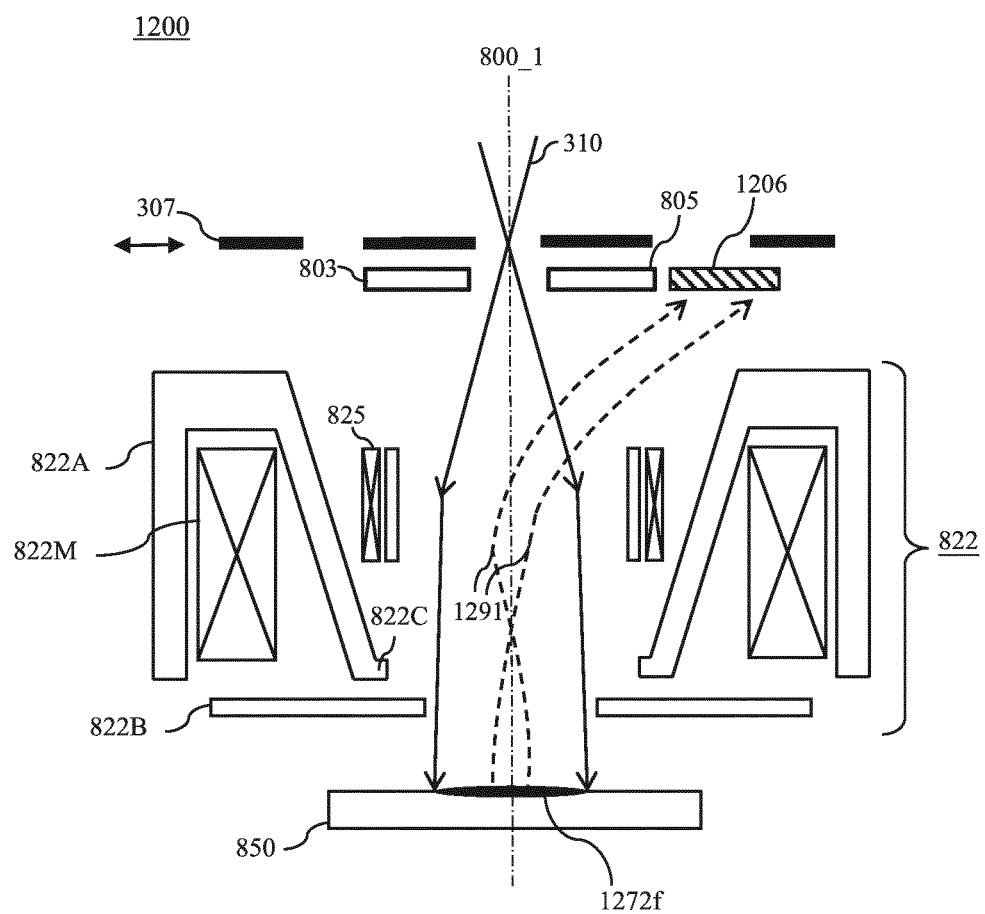
FIGS. 12A-12C are schematic diagrams illustrating an exemplary electron beam tool operating in a flooding mode and an inspection mode, consistent with embodiments of the present disclosure.
Figure 12B:
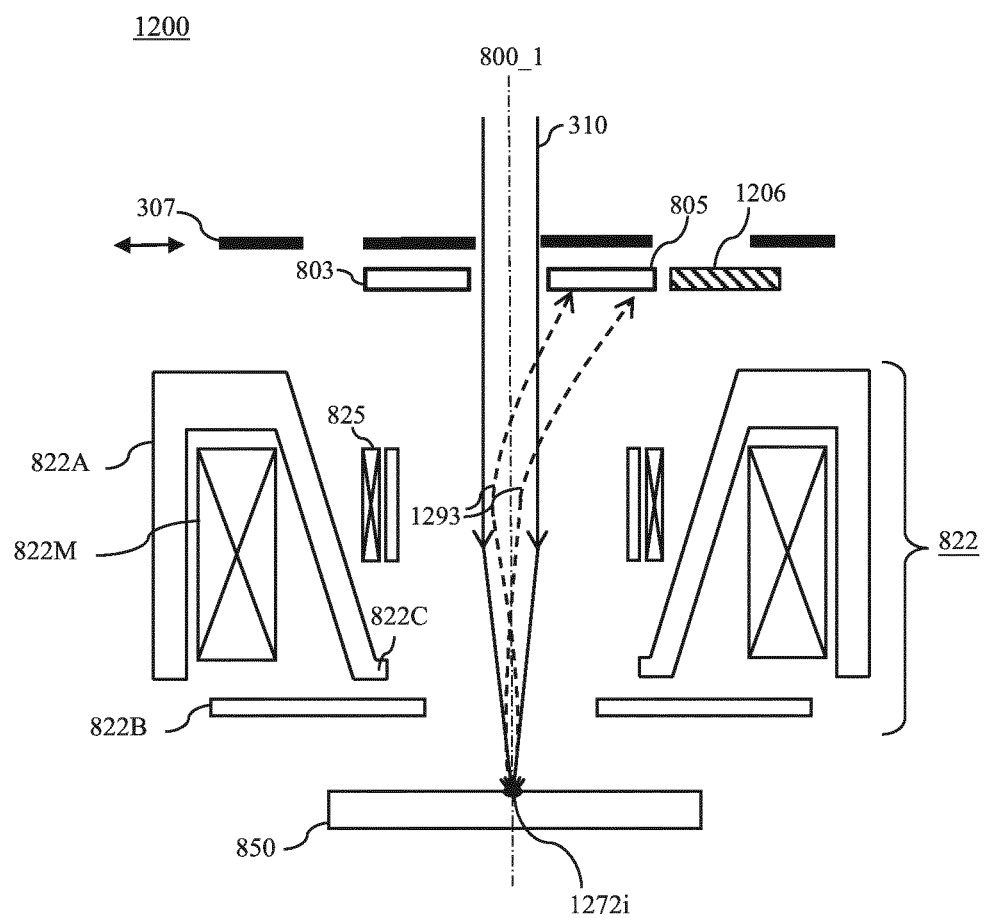
Figure 12C:
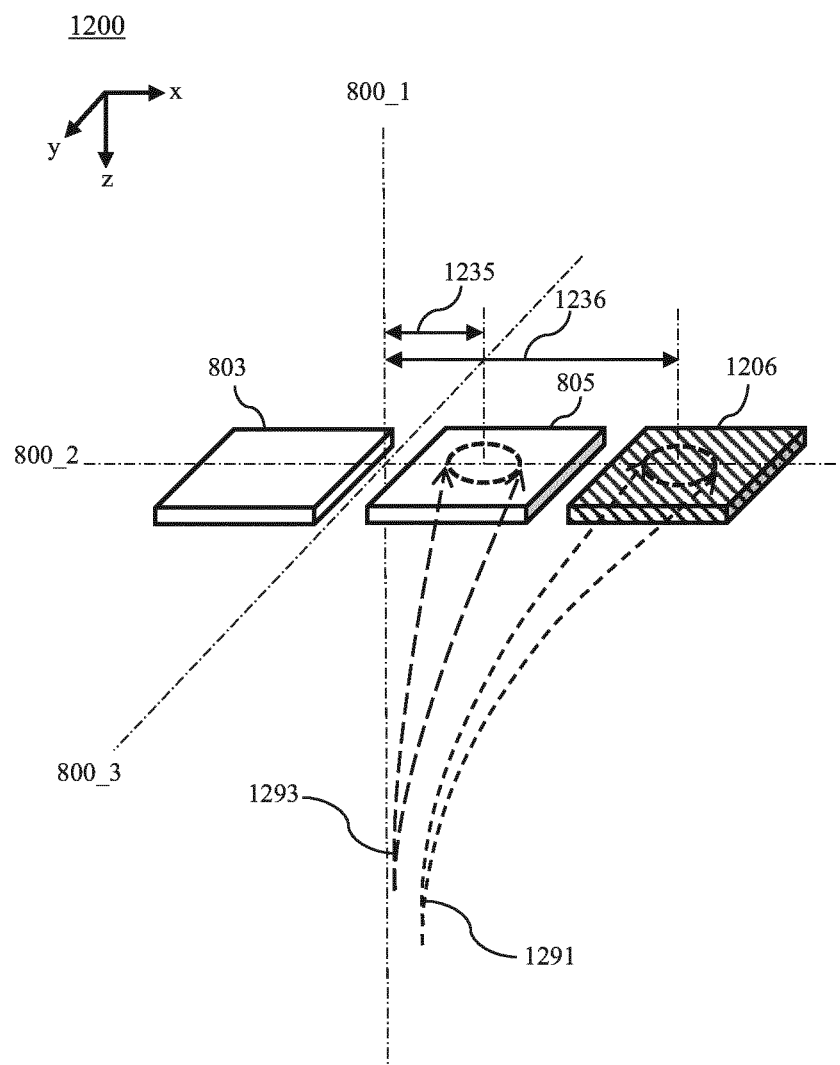

Reference is now made to FIGS. 12A-12C, which are schematic diagrams illustrating an exemplary electron beam tool 1200 operating in a flooding mode (FIG. 12A) and an inspection mode (FIG. 12B), consistent with embodiments of the present disclosure. Similar to the electron beam tool 1100 shown in FIGS. 11A-11B, the electron beam tool 1200 may use the signal electron deflector 825 to deflect signal electrons toward different targets based on the operating mode. For example, in the flooding mode, as shown in FIG. 12A, the signal electron deflector 825 may deflect signal electrons 1291 toward an electron stopper 1206 positioned next to the electron detector 805. In the inspection mode, as shown in FIG. 12B, the signal electron deflector 825 may deflect signal electrons 1293 toward the electron detector 805 for detection. In some embodiments, the electron stopper 1206 may comprise a passive energy filter, similar to the electron stopper 1006 shown in FIGS. 10A-10B.

As illustrated in FIGS. 12A-12C, in some embodiments, the electron stopper 1206 may be positioned farther away from the primary optical axis 800_1. Accordingly, during the flooding mode, the electron signal deflector 825 may need to produce stronger deflection power to bend to deflect the signal electrons with larger deflection polar angle (polar angle with respect to the primary optical axis 800_1).

FIG. 12C shows a three-dimensional representation of the detectors 803, 805 and the electron stopper 1206 of the electron beam tool 1200 shown in FIGS. 12A-12B. In some embodiments, the detectors 803, 805 and the electron stopper 1206 may be arranged on a XY-plane formed by X-axis and Y-axis, where the primary optical axis 800_1 is aligned with Z-axis. In some embodiments, the detectors 803, 805 and the electron stopper 1206 may be positioned along with an axis 800_2 that is aligned with the X-axis.

When the electron beam tool 1200 operates in the inspection mode, signal electrons 1293 may be directed to the detector 805. When the electron tool 1200 operates in the flooding mode, signal electrons 1291 may be bent further away from the primary optical axis 800_1 and directed to the electron stopper 1206. Accordingly, in some embodiments, the distance 1235 between the primary optical axis 800_1 and the center of the detector 805 may be smaller than the distance 1236 between the primary optical axis 800_1 and the center of the stopper 1206.

In a typical electron beam inspection system, an increased deflection polar angle can result in increased deflection aberration, such as dispersion-like chromatic aberration, which may deteriorate the primary beam resolution. However, because no image is generated during the flooding mode, the inspection system may not need to provide high resolution performance during the flooding mode, and therefore the signal electrons 1291 can be deflected with a larger deflection polar angle without affecting the overall system performance. Another way is to change the relative azimuth angle of the signal electrons with respect to the detectors. However, rotating the detector is less feasible than rotating the beam, which leads to the next embodiment.

Figure 13:
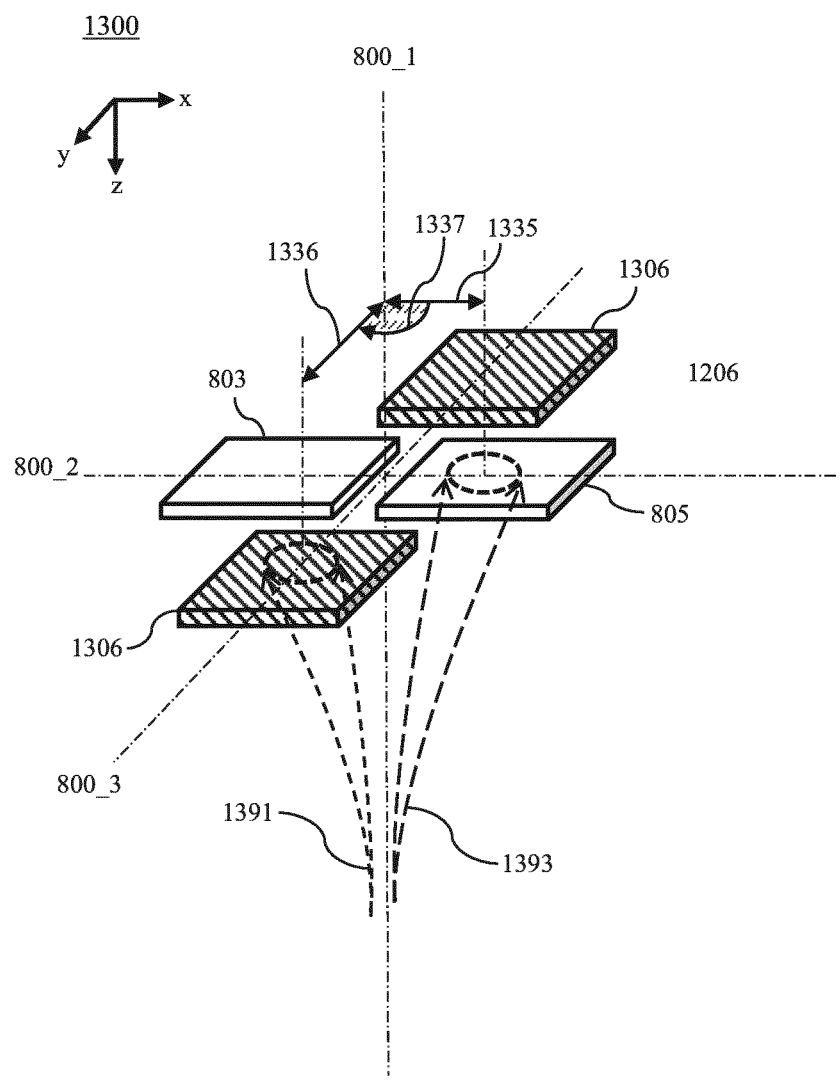
FIG. 13 is a schematic diagram illustrating an exemplary electron beam tool operating in a flooding mode and an inspection mode, consistent with embodiments of the present disclosure.

FIG. 13 shows another exemplary arrangement of detectors 803, 805 and an electron stopper 1306 of an electron beam tool 1300, consistent with embodiments of the present disclosure. Similar to the electron beam tool 1200 of FIG. 12C, in some embodiments, the detectors 803, 805 and the electron stopper 1306 may be arranged on the XY-plane. In some embodiments, the detectors 803, 805 may be positioned along with an axis 800_2 that is aligned, for example, with the X-axis, and the electron stopper 1306 may be positioned along with an axis 800_3 that is aligned, for example, with the Y-axis.

When the electron beam tool 1300 operates in the inspection mode, signal electrons 1393 may be directed to the detector 805. When the electron beam tool 1300 operates in the flooding mode, signal electrons 1391 may be bent around the primary optical axis 800_1 and directed to the electron stopper 1306. For example, during the flooding mode, a signal electron deflector (such as the signal electron deflector 825 of FIGS. 12A-12B) may generate a rotational electro-magnetic field to rotate signal electrons 1391 around the primary optical axis 800_1 about 90 degrees (as shown by an azimuth angle 1337) toward the electron stopper 1306.

Accordingly, the distance 1335 (between the primary optical axis 800_1 and the center of the detector 805) and the distance 1336 (between the primary optical axis 800_1 and the center of the stopper 1306) may be the same. In other words, the deflection polar angle (polar angle with respect to the primary optical axis 800_1) may not change substantially between the operating modes, while the signal electrons in the flooding mode is prevented from reaching the detector 805 as they are rotated azimuthally. In some embodiments, the polar angle may stay the same within 5 degrees. In such configurations, the bending power of the signal electron deflector does not need to be increased during the flooding mode, which may be desirable for certain embodiments because of reduced risk of an electric arc discharge and heat generation in the Wien Filter.

Figure 14:
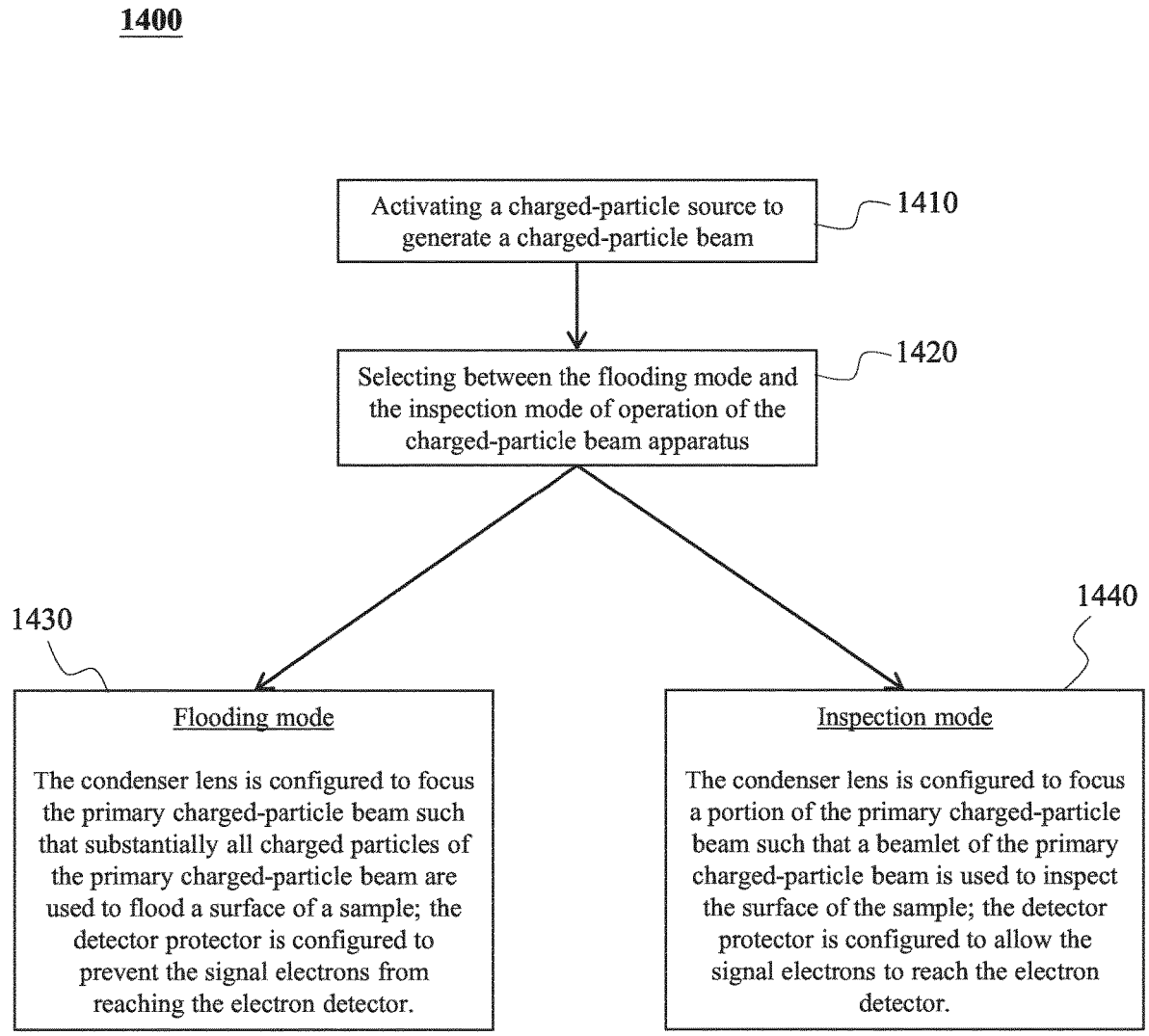
FIG. 14 is a process flowchart representing an exemplary method of forming a probe spot on a surface of a sample in a single-beam apparatus, consistent with embodiments of the present disclosure.

Reference is now made to FIG. 14, which illustrates a process flowchart representing an exemplary method 1400 of forming a probe spot on a surface of a sample in a single-beam apparatus, consistent with embodiments of the present disclosure. Method 1400 may be performed by controller 50 of the charged particle beam inspection system 100, as shown in FIG. 1, for example. Controller 50 may be programmed to perform one or more blocks of method 1400. For example, controller 50 may apply an electrical signal to condenser lens to adjust the focus of primary charged particle beam based on the selected mode of operation and carry out other functions.

In step 1410, a charged particle source (e.g., electron source 301 of FIG. 3) may be activated to generate a charged particle beam (e.g., primary electron beam 310 of FIG. 3). The electron source may be activated by a controller (e.g., controller 50 of FIG. 1). For example, the electron source may be controlled to emit primary electrons to form an electron beam along a primary optical axis (e.g., primary optical axis 300_1 of FIG. 3). The electron source may be activated remotely, for example, by using a software, an application, or a set of instructions for a processor of a controller to power the electron source through a control circuitry.

The EBI system may provide a mechanism to support multiple modes of operation. For example, electron beam tool (e.g., electron beam tool 300 of FIG. 3) may be configured to operate in a flooding mode to highlight a voltage contrast defect by flooding a surface of a sample with charged particles (e.g., electrons), and an inspection mode to analyze any defects highlighted during the flooding mode, using high resolution imaging methods. Electron beam tool may be configured to switch between modes of operation. For example, a complete scan of voltage contrast defect detection and analysis may include flooding the surface of the sample for a predetermined time duration, followed by high resolution inspection of any defects identified by flooding.

In step 1420, a mode of operation of the electron beam tool, such as a flooding mode or inspection mode, may be selected. In some embodiments, a user may select the mode of operation based on factors including, but are not limited to, the application, the requirements, and desired analysis. In some embodiments, electron beam tool may be programmed to run without user interaction, for example, performing selection of a mode of operation, operating the inspection tool in the selected mode of operation, or performing a series of steps including switching the mode of operation. For example, a controller (e.g., controller 50 of FIG. 2) may be programmed to initiate voltage contrast defect detection by activating the flooding mode, to adjust electrical excitation of a condenser lens (e.g., condenser lens 303 of FIG. 3) to adjust the focusing power, to switch to inspection mode after completing flooding, and the like.

In step 1430, the electron beam tool may be configured to operate in the flooding mode in which, the controller may apply an electrical signal to the condenser lens such that substantially all electrons of the primary electron beam passing through a selected aperture of an aperture array (e.g., Coulomb aperture array 308 of FIG. 3) may be focused to form a crossover in a crossover plane. The crossover plane may coincide with the plane in which a beam-limiting aperture array (e.g., beam-limiting aperture array 307 of FIG. 3) is disposed. The beam-limiting aperture array may be configured to allow through substantially all electrons of the electron beam from the condenser lens and to direct the primary electron beam towards an objective lens (e.g., objective lens assembly 304 of FIG. 3). The objective lens may be configured to defocus the primary electron beam to form a probe spot on a surface of a sample (e.g., sample 350 of FIG. 3).

The electron beam tool may comprise a current-limiting aperture array (e.g., current-limiting aperture plate 409 of FIG. 5) configured to allow passage of electrons of the primary electron beam, based on the mode of operation. For example, in the flooding mode, the current-limiting aperture plate may allow substantially all electrons of the primary electron beam to pass through. The position of the current-limiting aperture plate along the Z-axis may be adjusted such that the maximum electrons may pass through to allow formation of a beam having a large beam current. The current-limiting aperture plate may be placed downstream of the condenser lens and at an optimum distance away from the condenser lens along the primary optical axis.

The electron beam exiting the objective lens and incident on the surface of the sample may comprise a defocused beam having large beam current. The probe spot formed by the defocused electron beam may comprise a defocused large probe spot configured to flood the surface of the sample with charged particles such as electrons. The sample may be flooded for a predetermined time duration, or the time may be adjusted based on factors including, but are not limited to, the sample, the application, the defect characteristics, and the like. The variability in conductivity of the features on sample surface causes a variability in contrast in the images produced from the secondary electrons emitted by the beam-sample interaction.

Furthermore, when the electron beam tool operates in the flooding mode, to protect the electron detector, a detector protector may be configured to prevent the plurality of signal electrons from reaching the electron detector. In some embodiments, the detector protector comprising an active energy filter (e.g., an energy filter formed by control electrode 822B and the sample 850 in FIG. 8; the active energy filter 906 of FIG. 9A) may be configured to filter out high-energy signal electrons generated from the sample during the flooding mode. When the apparatus operates in the inspection mode, the active energy filter may be inactivated so that the signal electrons can pass through the active energy filter and be detected by the electron detector. In some embodiments, the detector protector comprising an electron stopper (e.g., the electron stopper 1006 of FIG. 10A, 1106 of FIG. 11A, and 1206 of FIG. 12A) may be configured to block the high-energy signal electrons during the flooding mode.

In step 1440, in the inspection mode of operation, the primary electron beam emanating from a primary beam crossover (virtual or real) (e.g., primary beam crossover 302 of FIG. 4B) may pass through a Coulomb aperture (e.g., aperture 308-1 of FIG. 4B) of the Coulomb aperture array. Though using a smaller aperture (e.g., aperture 308-2 or 308-3 of FIG. 4B) may enhance the inspection resolution and sensitivity by reducing the Coulomb interaction effects, adjusting the Coulomb aperture array to switch from a large aperture (e.g., aperture 308-1) to smaller apertures (e.g., smaller apertures 308-2 or 308-3) may negatively impact the inspection throughput. Therefore, it may be desirable to maintain the aperture size of the Coulomb aperture array during the flooding and inspection modes of operation. In some embodiments, the Coulomb aperture array may be adjusted to switch from using the larger aperture to smaller apertures to enhance inspection resolution and inspection sensitivity or defect detectability.

The controller may adjust the electrical excitation of the condenser lens to adjust the focusing power of the condenser lens. An electrical signal may be applied to the condenser lens such that the probing beamlet of the primary electron beam may be focused using the objective lens to form a focused probe spot on the surface of the sample. The electrical signal applied to the condenser lens may cause the primary electron beam to be incident on the aperture plate such that a portion of peripheral electrons of the primary electron beam may be blocked off from propagating towards the sample. In the inspection mode of operation, the aperture plate may function as a current-limiting aperture plate, configured to trim peripheral electrons of the primary electron beam and to reduce the Coulomb interaction effect. In some embodiments, the current-limiting aperture plate may comprise an array of apertures.

In the inspection mode of operation, the position of the current-limiting aperture plate may not be adjusted compared to its position in the flooding mode. This may help minimize inspection delays caused as a result of initiating mechanical components to enable movement of the current-limiting aperture plate, aligning the current-limiting aperture plate such that a geometric center of the current-limiting aperture aligns with the primary optical axis and other components of the system, while reducing Coulomb interaction effect by blocking off peripheral electrons.

In some embodiments, the position of the current-limiting aperture plate may be adjusted along the primary optical axis based on factors including, but are not limited to, the primary electron beam size, the focusing power of the condenser lens, the desired probing beam current, and the like. For example, the distance between the current-limiting aperture plate and beam-limiting aperture array may be increased by adjusting the position of the current-limiting aperture plate to minimize Coulomb interaction effects. In some embodiments, the size of aperture of the current-limiting aperture plate may be adjusted to minimize Coulomb interaction effects, for example, by reducing the size of the selected current-limiting aperture or selecting a smaller current-limiting aperture of the plurality of arrays in the current-limiting aperture plate. A smaller current-limiting aperture may allow fewer electrons to pass through, and therefore, minimize Coulomb interaction effects.

A portion of the electrons passing through the current-limiting aperture of the current-limiting aperture plate may pass through one beam-limiting aperture of the beam-limiting aperture array positioned downstream or immediately downstream of the current-limiting aperture plate. The portion may be directed towards and incident on the objective lens configured to focus the portion on the surface of sample to form a probe spot. The electrical excitation of objective lens may be the same in the flooding mode and in the inspection mode. The electrical excitation may comprise an electrical signal (e.g., voltage, current, and the like), for example, to adjust the electric or magnetic field influencing the energy, the path, the direction, and the like, of the electrons of that portion.

Furthermore, when the electron beam tool operates in the inspection mode, the detector protector may be configured to allow the plurality of signal electrons to reach the electron detector. In some embodiments, the detector protector comprising an active energy filter (e.g., an energy filter formed by control electrode 822B and the sample 850 in FIG. 8; the active energy filter 906 of FIG. 9A) may be inactivated so that the signal electrons can pass through the active energy filter and be detected by the electron detector. In some embodiments, the detector protector comprising an electron stopper (e.g., the electron stopper 1006 of FIG. 10A, 1106 of FIG. 11A, and 1206 of FIG. 12A) may be configured to move away from the path that signal electron travels, so that the signal electrons can be detected by the electron detector.

The embodiments may further be described using the following clauses:

1. A charged-particle beam apparatus comprising:
    a charged-particle source configured to generate a primary charged-particle beam along a primary optical axis;
    a first aperture array comprising a first aperture configured to allow at least a first portion of the primary charged-particle beam to pass through;
    a condenser lens configured to focus the at least a first portion of the primary charged-particle beam based on a selected mode of operation of the apparatus, wherein the selected mode of operation includes a first mode and a second mode; and
    an aperture plate comprising a second aperture configured to form a second portion of the primary charged-particle beam, wherein:
        in the first mode of operation, substantially all of the second portion of the primary charged-particle beam is used to flood a surface of a sample, and
        in the second mode of operation, at least some of the second portion of the primary charged-particle beam is used to inspect the surface of the sample.

2. The apparatus of clause 1, wherein the first aperture is configured to block peripheral charged particles of the primary charged-particle beam to form the first portion of the primary charged-particle beam.

3. The apparatus of any one of clauses 1 and 2, wherein the first aperture array includes at least two apertures that are dissimilar in size.

4. The apparatus of any one of clauses 1-3, wherein the first aperture array is disposed in and is movable in a first plane substantially perpendicular to the primary optical axis.

5. The apparatus of any one of clauses 1-4, wherein the first aperture array is disposed between the charged-particle source and the condenser lens along the primary optical axis.

6. The apparatus of any one of clauses 1-5, wherein the second aperture is a current-limiting aperture configured to:
    in the first mode of operation, allow substantially all charged particles of the first portion of the primary charged-particle beam to pass through to form the second portion of the primary charged-particle beam; and
    in the second mode of operation, block peripheral charged particles of the first portion of the primary charged-particle beam to form the second portion of the primary charged-particle beam.

7. The apparatus of any one of clauses 1-6, wherein the aperture plate is movable along the primary optical axis.

8. The apparatus of clause 7, wherein the aperture plate comprises a current-limiting aperture array movable along a second plane substantially perpendicular to the primary optical axis.

9. The apparatus of any one of clauses 1-6, wherein the aperture plate comprises a current-limiting aperture array movable along a second plane substantially perpendicular to the primary optical axis.
10. The apparatus of any one of clauses 1-9, further comprising a beam-limiting aperture array configured to limit a beam current of the second portion of the primary charged-particle beam in the second mode.
11. The apparatus of clause 10, wherein the beam-limiting aperture array comprises a plurality of beam-limiting apertures, and at least two beam-limiting apertures of the plurality of beam-limiting apertures are dissimilar in size.
12. The apparatus of any one of clauses 10 and 11, wherein the beam-limiting aperture array is disposed in and is movable in a third plane substantially perpendicular to the primary optical axis.
13. The apparatus of any one of clauses 11 and 12, wherein in the first and the second modes of operation, the first aperture and a beam-limiting aperture of the plurality of beam-limiting apertures are the same.
14. The apparatus of any one of clauses 12 and 13, wherein in the first mode of operation, the condenser lens is configured to cause the second portion of the primary charged-particle beam to form a crossover close to the third plane such that substantially all charged particles of the second portion of the primary charged-particle beam pass through an aperture of the beam-limiting aperture array.
15. The apparatus of clause 14, wherein in the second mode of operation, the aperture of the beam-limiting aperture array is configured to limit a beam current of the second portion of the primary charged-particle beam.
16. The apparatus of any one of clauses 8-15, further comprising an objective lens, wherein in the first mode of operation, the objective lens is configured to defocus the second portion of the primary charged-particle beam and to form a first spot on the surface of the sample, the first spot having a first current level.
17. The apparatus of clause 16, wherein in the second mode of operation, the objective lens is configured to focus the at least some of the second portion of the primary charged-particle beam passing through the aperture of the beam-limiting aperture array to form a second spot on the surface of the sample, the second spot having a second current level.
18. The apparatus of clause 17, wherein an electrical excitation of the objective lens in the first mode of operation is same or substantially similar to an electrical excitation of the objective lens in the second mode of operation.
19. The apparatus of any one of clauses 17-18, wherein the first current level is greater than or equal to the second current level.
20. The apparatus of any one of clauses 17-19, wherein the first spot is larger than or equal to the second spot.
21. The apparatus of any one of clauses 1-20, further comprising a controller configured to:
perform charged-particle flooding on the surface of the sample in the first mode; and
perform charged-particle beam inspection of the surface of the sample in the second mode.
22. The apparatus of clause 21, wherein the controller is further configured to adjust an electrical excitation of the condenser lens based on the selected mode of operation.
23. The apparatus of any one of clauses 1-22, further comprising:
an electron detector configured to detect a plurality of signal electrons generated from incidence of the primary charged-particle beam onto the sample when the apparatus is in the second mode of operation; and
a detector protector configured to prevent the plurality of signal electrons from reaching the electron detector when the apparatus is in the first mode of the operation.
24. The apparatus of clause 23, wherein the plurality of signal electrons comprises backscattered electrons (BSEs) or secondary electrons (SEs).
25. The apparatus of any one of clauses 23 and 24, wherein the controller is further configured to control the detector protector based on the selected mode of operation.
26. The apparatus of any one of clauses 23-25, wherein the detector protector comprises an active energy filter configured to generate an electric field that reflects all or a subset of the plurality of signal electrons.
27. The apparatus of clause 26, wherein the active energy filter comprises an electrode positioned between the sample and the objective lens, wherein the electrode is configured to be negatively biased with respect to the sample to generate the electric field.
28. The apparatus of clause 27, wherein the electrode is a part of the objective lens.
29. The apparatus of clause 26, wherein the active energy filter comprises a first electrode and a second electrode positioned between the electron detector and the objective lens, wherein the first electrode is configured to be negatively biased with respect to the second electrode to generate the electric field.
30. The apparatus of clause 29, wherein the first electrode comprises a mesh-electrode.
31. The apparatus of clause 29, wherein the first electrode comprises a tube-electrode.
32. The apparatus of any one of clauses 29-31, wherein the second electrode comprises a mesh-electrode.
33. The apparatus of any one of clauses 29-32, wherein the second electrode is connected to a ground.
34. The apparatus of any one of clauses 23-25, wherein the detector protector comprises an electron stopper movable between a first position and a second position, wherein:
when the apparatus is in the first mode of operation, the electron stopper is positioned in the first position between the sample and the electron detector and is configured to block the plurality of signal electrons, and
when the apparatus is in the second mode of operation, the electron stopper is positioned in the second position away from the electron detector and is configured to allow the plurality of signal electrons to pass through to the electron detector.
35. The apparatus of clause 34, wherein the electron stopper comprises a metal plate.
36. The apparatus of any one of clauses 34 and 35, wherein the electron stopper is connected to a ground.
37. The apparatus of any one of clauses 34-36, wherein the detector protector further comprises a deflector configured to change directions of the plurality of signal electrons, wherein:
when the apparatus is in the first mode of operation, the deflector is configured to deflect the plurality of signal electrons toward the electron stopper, and when the apparatus is in the second mode of operation, the deflector is configured to deflect the plurality of signal electrons toward the electron detector.

38. The apparatus of clause 37, wherein the deflector comprises an electric field generator and a magnetic field generator.

39. The apparatus of any one of clauses 37 and 38, wherein the deflector is a Wien filter.

40. The apparatus of any one of clauses 23-25, wherein the detector protector comprises:
an electron stopper positioned near the electron detector; and
a deflector configured to change directions of the plurality of signal electrons, wherein:
when the apparatus is in the first mode of operation, the deflector is configured to deflect the plurality of signal electrons toward the electron stopper at a first polar deflection angle and a first azimuthal deflection angle with respect to the primary optical axis, and
when the apparatus is in the second mode of operation, the deflector is configured to deflect the plurality of signal electrons toward the electron detector at a second polar deflection angle and a second azimuthal deflection angle with respect to the primary optical axis.

41. The apparatus of clause 40, wherein the electron stopper is positioned farther away from the primary optical axis than the electron detector.

42. The apparatus of any one of clauses 40 and 41, wherein the first polar deflection angle is larger than the second polar deflection angle.

43. The apparatus of any one of clauses 40-42, wherein the first azimuthal deflection angle and the second azimuthal deflection angle are the same or substantially similar.

44. The apparatus of clause 40, wherein the electron detector and the electron stopper are positioned around the primary optical axis.

45. The apparatus of any one of clauses 40 and 44, wherein the first polar deflection angle and the second polar deflection angle are the same or substantially similar.

46. The apparatus of any one of clauses 40, 44-45, wherein the first azimuthal deflection angle and the second azimuthal deflection angle are different.

47. The apparatus of any one of clauses 40, 44-46, wherein a difference between the first azimuthal deflection angle and the second azimuthal deflection angle is approximately 90 degrees.

48. The apparatus of any one of clauses 40-47, wherein the electron stopper comprises a metal plate.

49. The apparatus of any one of clauses 40-48, wherein the electron stopper is connected to a ground.

50. The apparatus of any one of clauses 40-49, wherein the deflector comprises an electric field generator and a magnetic field generator.

51. The apparatus of any one of clauses 40-50, wherein the deflector is a Wien filter.

52. A method of forming a probe spot on a surface of a sample in a charged-particle beam apparatus comprising a first aperture array, a condenser lens, a second aperture array, and an aperture plate, the method comprising:
activating a charged-particle source to generate a primary charged-particle beam along a primary optical axis; and
selecting between a first mode and a second mode of operation of the charged-particle beam apparatus, wherein:
in the first mode of operation, the condenser lens is configured to focus at least a first portion of the primary charged-particle beam such that the at least a first portion passes through an aperture of the aperture plate to form a second portion of the primary charged-particle beam, and substantially all of the second portion of the primary charged-particle beam is used to flood a surface of a sample, and
in the second mode of operation, the condenser lens is configured to focus the at least a first portion of the primary charged-particle beam such that the aperture of the aperture plate blocks off peripheral charged-particles of the at least a first portion to form the second portion of the primary charged-particle beam, and at least some of the second portion of the primary charged-particle beam is used to inspect the surface of the sample.

53. The method of clause 52, further comprising blocking peripheral charged particles of the primary charged-particle beam to form the at least the first portion of the primary charged-particle beam.

54. The method of any one of clauses 52 and 53, wherein the first aperture array is disposed in and is movable in a first plane substantially perpendicular to the primary optical axis.

55. The method of any one of clauses 52-54, wherein the first aperture array is disposed between the charged-particle source and the condenser lens.

56. The method of any one of clauses 54-55, wherein forming the at least the first portion of the primary charged-particle beam comprises adjusting a position of the first aperture array in the first plane such that a center of an aperture of the first aperture array is aligned with the primary optical axis.

57. The method of any one of clauses 52-56, wherein the aperture plate is movable along the primary optical axis.

58. The method of clause 57, wherein the aperture plate comprises a current-limiting aperture array movable along a second plane substantially perpendicular to the primary optical axis.

59. The method of clause 58, wherein the current-limiting aperture array is movable along the primary optical axis.

60. The method of any one of clauses 52-59, further comprising, in the first mode, defocusing the second portion of the primary charged-particle beam and forming a first spot on the surface of the sample, the first spot having a first current level.

61. The method of any one of clauses 57-60, further comprising, in the second mode:
limiting a beam current of the second portion of the primary charged-particle beam using a beam-limiting aperture array, an aperture of the beam-limiting aperture array configured to form the at least some of the second portion of the primary charged-particle beam; and
focusing the at least some of the second portion of the primary charged-particle beam and forming a second spot on the surface of the sample, the second spot having a second current level.

62. The method of clause 61, wherein in the first and the second modes of operation, the first aperture and the aperture of the beam-limiting aperture array are the same.
63. The method of any one of clauses 61 and 62, wherein the first current level is greater than the second current level.
64. The method of any one of clauses 61 and 63, wherein the first spot is larger than or equal to the second spot.
65. The method of any one of clauses 52-64, further comprising switching, using a controller, between the first mode and the second mode of operation.
66. The method of clause 65, further comprising adjusting, using the controller, an electrical excitation of the condenser lens based on the selected mode of operation.
67. The method of any one of clauses 52-66, further comprising performing charged-particle flooding on the surface of the sample in the first mode of operation.
68. The method of any one of clauses 52-67, further comprising performing charged-particle beam inspection of the surface of the sample in the second mode of operation.
69. A non-transitory computer readable medium storing a set of instructions that is executable by one or more processors of a charged-particle beam apparatus to cause the charged particle beam apparatus to perform a method of inspecting a sample, the method comprising:
activating a charged-particle source to generate a primary charged-particle beam along a primary optical axis; and
selecting between a first mode and a second mode of operation of the charged-particle beam apparatus, wherein:
in the first mode of operation, a condenser lens is configured to focus at least a first portion of the primary charged-particle beam such that the at least a first portion passes through an aperture of an aperture plate to form a second portion of the primary charged-particle beam, and substantially all of the second portion of the primary charged-particle beam is used to flood a surface of a sample, and
in the second mode of operation, the condenser lens is configured to focus the at least a first portion of the primary charged-particle beam such that the aperture of the aperture plate blocks off peripheral charged-particles of the at least a first portion to form the second portion of the primary charged-particle beam, and at least some of the second portion of the primary charged-particle beam is used to inspect the surface of the sample.
70. A charged-particle beam apparatus comprising:
a charged-particle source configured to generate a primary charged-particle beam along a primary optical axis;
a condenser lens configured to change a focus level of the primary charged-particle beam on a sample based on operation modes of the apparatus, wherein the operation modes include an inspection mode and a flooding mode,
an electron detector configured to detect a plurality of signal electrons generated from incidence of the primary charged-particle beam onto the sample; and
a detector protector configured to:
prevent the plurality of signal electrons from reaching the electron detector when the apparatus operates in the flooding mode, and
allow the plurality of signal electrons to reach the electron detector when the apparatus operates in the inspection mode.
71. The apparatus of clause 70, wherein the plurality of signal electrons comprises backscattered electrons (BSEs) or secondary electrons (SEs).
72. The apparatus of any one of clauses 70 and 71, wherein the detector protector comprises an active energy filter configured to generate an electric field that reflects all or a subset of the plurality of signal electrons.
73. The apparatus of clause 72, wherein the active energy filter comprises an electrode positioned between the sample and the objective lens, wherein the electrode is configured to be negatively biased with respect to the sample to generate the electric field.
74. The apparatus of clause 73, wherein the electrode is a part of the objective lens.
75. The apparatus of clause 72, wherein the active energy filter comprises a first electrode and a second electrode positioned between the electron detector and the objective lens, wherein the first electrode is configured to be negatively biased with respect to the second electrode to generate the electric field.
76. The apparatus of clause 75, wherein the first electrode comprises a mesh-electrode.
77. The apparatus of clause 75, wherein the first electrode comprises a tube-electrode.
78. The apparatus of any one of clauses 75-77, wherein the second electrode comprises a mesh-electrode.
79. The apparatus of any one of clauses 75-78, wherein the second electrode is connected to a ground.
80. The apparatus of any one of clauses 70 and 71, wherein the detector protector comprises an electron stopper movable between a first position and a second position, wherein:
when the apparatus operates in the flooding mode, the electron stopper is positioned in the first position between the sample and the electron detector and is configured to block the plurality of signal electrons, and
when the apparatus operates in the inspection mode, the electron stopper is positioned in the second position away from the electron detector and is configured to allow the plurality of signal electrons to pass through to the electron detector.
81. The apparatus of clause 80, wherein the electron stopper comprises a metal plate.
82. The apparatus of any one of clauses 80 and 81, wherein the electron stopper is connected to a ground.
83. The apparatus of any one of clauses 80-82, wherein the detector protector further comprises a deflector configured to change directions of the plurality of signal electrons, wherein:
when the apparatus operates in the flooding mode, the deflector is configured to deflect the plurality of signal electrons toward the electron stopper, and
when the apparatus operates in the inspection mode, the deflector is configured to deflect the plurality of signal electrons toward the electron detector.
84. The apparatus of clause 83, wherein the deflector comprises an electric field generator and a magnetic field generator.
85. The apparatus of any one of clauses 83 and 84, wherein the deflector is a Wien filter.
86. The apparatus of any one of clauses 70 and 71, wherein the detector protector comprises:

an electron stopper positioned near the electron detector; and a deflector configured to change directions of the plurality of signal electrons, wherein:
when the apparatus operates in the flooding mode, the deflector is configured to deflect the plurality of signal electrons toward the electron stopper at a first polar deflection angle and a first azimuthal deflection angle with respect to the primary optical axis, and
when the apparatus operates in the inspection mode, the deflector is configured to deflect the plurality of signal electrons toward the electron detector at a second polar deflection angle and a second azimuthal deflection angle with respect to the primary optical axis.

87. The apparatus of clause 86, wherein the electron stopper is positioned farther away from the primary optical axis than the electron detector.

88. The apparatus of any one of clauses 86 and 87, wherein the first polar deflection angle is larger than the second polar deflection angle.

89. The apparatus of any one of clauses 86-88, wherein the first azimuthal deflection angle and the second azimuthal deflection angle are the same or substantially similar.

90. The apparatus of clause 86, wherein the electron detector and the electron stopper are positioned around the primary optical axis.

91. The apparatus of any one of clauses 86 and 90, wherein the first polar deflection angle and the second polar deflection angle are the same or substantially similar.

92. The apparatus of any one of clauses 86, 90-91, wherein the first azimuthal deflection angle and the second azimuthal deflection angle are different.

93. The apparatus of any one of clauses 86, 90-92, wherein a difference between the first azimuthal deflection angle and the second azimuthal deflection angle is approximately 90 degrees.

94. The apparatus of any one of clauses 86-93, wherein the electron stopper comprises a metal plate.

95. The apparatus of any one of clauses 86-94, wherein the electron stopper is connected to a ground.

96. The apparatus of any one of clauses 86-95, wherein the deflector comprises an electric field generator and a magnetic field generator.

97. The apparatus of any one of clauses 86-96, wherein the deflector is a Wien filter.

A non-transitory computer readable medium may be provided that stores instructions for a processor of a controller (e.g., controller 50 of FIG. 1) for carrying out image inspection and image acquisition, selecting the modes of operation, activating charged-particle source, adjusting the electrical excitation of condenser lens, moving the sample stage to adjust the position of the sample, and the like. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A charged-particle beam apparatus comprising:
a charged-particle source configured to generate a primary charged-particle beam along a primary optical axis;
a condenser lens configured to change a focus level of the primary charged-particle beam on a sample based on operation modes of the apparatus, wherein the operation modes include an inspection mode and a flooding mode;
an electron detector configured to detect a plurality of signal electrons generated from incidence of the primary charged-particle beam onto the sample; and
a detector protector configured to:
prevent the plurality of signal electrons from reaching the electron detector when the apparatus operates in the flooding mode, and
allow the plurality of signal electrons to reach the electron detector when the apparatus operates in the inspection mode.

2. The charged-particle beam apparatus of claim 1, wherein the detector protector comprises an active energy filter configured to generate an electric field that reflects all or a subset of the plurality of signal electrons.

3. The charged-particle beam apparatus of claim 2, wherein the active energy filter comprises an electrode positioned between the sample and the objective lens, and wherein the electrode is configured to be negatively biased with respect to the sample to generate the electric field.

4. The charged-particle beam apparatus of claim 2, wherein the active energy filter comprises a first electrode and a second electrode positioned between the electron detector and the objective lens, wherein the first electrode is configured to be negatively biased with respect to the second electrode to generate the electric field.

5. The charged-particle beam apparatus of claim 4, wherein the first electrode comprises a mesh-electrode or a tube electrode.

6. The charged-particle beam apparatus of claim 4, wherein the second electrode comprises a mesh-electrode connected to a ground.

7. The charged-particle beam apparatus of claim 1, wherein the detector protector comprises an electron stopper movable between a first position and a second position, wherein:
when the apparatus operates in the flooding mode, the electron stopper is positioned in the first position between the sample and the electron detector and is configured to block the plurality of signal electrons, and
when the apparatus operates in the inspection mode, the electron stopper is positioned in the second position away from the electron detector and is configured to allow the plurality of signal electrons to pass through to the electron detector.

8. The charged-particle beam apparatus of claim 7, wherein the detector protector further comprises a deflector configured to change directions of the plurality of signal electrons, wherein:
when the apparatus operates in the flooding mode, the deflector is configured to deflect the plurality of signal electrons toward the electron stopper, and
when the apparatus operates in the inspection mode, the deflector is configured to deflect the plurality of signal electrons toward the electron detector.

9. The charged-particle beam apparatus of claim 8, wherein the deflector comprises an electric field generator and a magnetic field generator.

10. The charged-particle beam apparatus of claim 8, wherein the deflector is a Wien filter.

11. The charged-particle beam apparatus of claim 1, wherein the detector protector comprises:
an electron stopper positioned near the electron detector; and
a deflector configured to change directions of the plurality of signal electrons, wherein:
when the apparatus operates in the flooding mode, the deflector is configured to deflect the plurality of signal electrons toward the electron stopper at a first polar deflection angle and a first azimuthal deflection angle with respect to the primary optical axis, and
when the apparatus operates in the inspection mode, the deflector is configured to deflect the plurality of signal electrons toward the electron detector at a second polar deflection angle and a second azimuthal deflection angle with respect to the primary optical axis.

12. The charged-particle beam apparatus of claim 11, wherein the electron stopper is positioned farther away from the primary optical axis than the electron detector.

13. The charged-particle beam apparatus of claim 11, wherein the first polar deflection angle is larger than the second polar deflection angle.

14. The charged-particle beam apparatus of claim 11, wherein the first polar deflection angle and the second polar deflection angle are the same or substantially similar.

15. The charged-particle beam apparatus of claim 11, wherein the first azimuthal deflection angle and the second azimuthal deflection angle are the same or substantially similar.

16. The charged-particle beam apparatus of claim 11, wherein a difference between the first azimuthal deflection angle and the second azimuthal deflection angle is approximately 90 degrees.

17. The charged-particle beam apparatus of claim 11, wherein the electron stopper comprises a metal plate, and wherein the electron stopper is connected to a ground.

18. The charged-particle beam apparatus of claim 11, wherein the deflector comprises an electric field generator and a magnetic field generator.

19. The charged-particle beam apparatus of claim 11, wherein the deflector is a Wien filter.

20. A non-transitory computer readable medium storing a set of instructions that is executable by one or more processors of a charged-particle beam apparatus comprising a charged-particle source, a condenser lens, an electron detector, and a detector protector, to cause the charged-particle beam apparatus to perform a method of inspecting a sample, the method comprising:
activating the charged-particle source to generate a primary charged-particle beam along a primary optical axis;
changing an electrical excitation of the condenser lens to change a focus level of the primary charged-particle beam on the sample based on operation modes of the charged-particle beam apparatus, wherein the operation modes include an inspection mode and a flooding mode;
enabling the electron detector to detect a plurality of signal electrons generated from incidence of the primary charged-particle beam onto the sample; and
activating the detector protector to:
prevent the plurality of signal electrons from reaching the electron detector when the charged-particle beam apparatus operates in the flooding mode, and
allow the plurality of signal electrons to reach the electron detector when the charged-particle beam apparatus operates in the inspection mode.

* * * * *